(12) United States Patent
Nanba et al.

(10) Patent No.: US 8,043,440 B2
(45) Date of Patent: Oct. 25, 2011

(54) CLEANING APPARATUS AND METHOD AND COMPUTER READABLE MEDIUM

(75) Inventors: Hiromitsu Nanba, Koshi (JP); Norihiro Ito, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 369 days.

(21) Appl. No.: 11/976,188

(22) Filed: Oct. 22, 2007

(65) Prior Publication Data
US 2008/0173333 A1 Jul. 24, 2008

(30) Foreign Application Priority Data

Oct. 23, 2006 (JP) ................................. 2006-287758
Aug. 30, 2007 (JP) ................................. 2007-224237

(51) Int. Cl.
*B08B 3/00* (2006.01)
(52) U.S. Cl. ................ 134/26; 134/30; 134/33; 134/34; 134/36; 134/37
(58) Field of Classification Search ............... 134/26, 134/30, 33, 34, 36, 37
See application file for complete search history.

(56) References Cited

U.S. PATENT DOCUMENTS

| 6,227,786 B1 * | 5/2001 | Tateyama ...................... 118/724 |
| 2002/0096196 A1 * | 7/2002 | Toshima et al. .................. 134/21 |
| 2006/0219264 A1 * | 10/2006 | Miya ............................... 134/21 |

FOREIGN PATENT DOCUMENTS

JP     9-298181     11/1997

\* cited by examiner

*Primary Examiner* — Michael Kornakov
*Assistant Examiner* — Douglas Lee
(74) *Attorney, Agent, or Firm* — Smith, Gambrell & Russell, LLP

(57) ABSTRACT

A control mechanism of a cleaning apparatus is preset to control the apparatus for a cleaning process or a rinsing process to include delivering a process liquid, which is corresponding one of a cleaning liquid and a rinsing liquid, from a back surface liquid supply nozzle through a liquid delivery port, thereby forming a liquid film on the back surface of a substrate, and then once stopping and then re-starting delivery of the process liquid from the back surface liquid supply nozzle, thereby forming a liquid film also on a portion around the liquid delivery port, so as to process the portion around the liquid delivery port as well as the substrate.

10 Claims, 16 Drawing Sheets

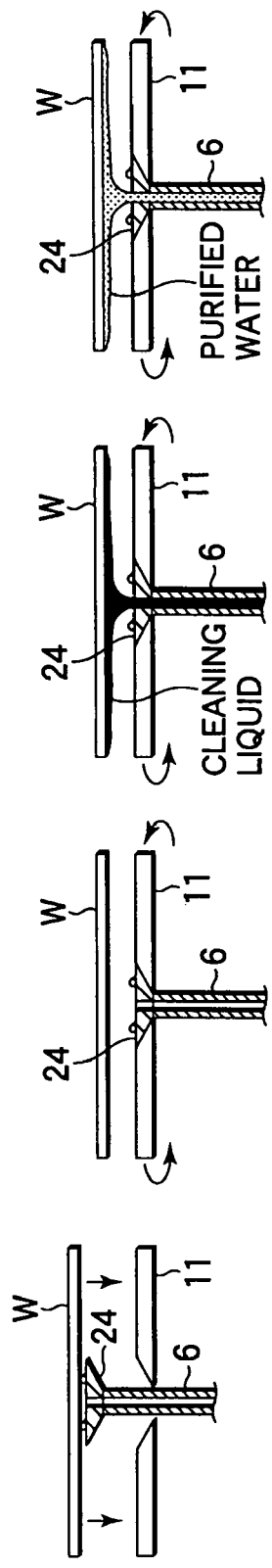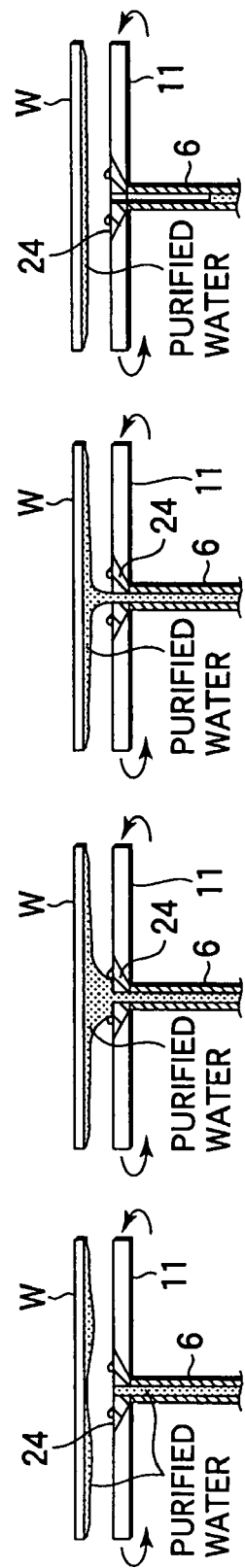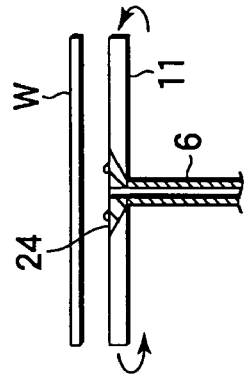

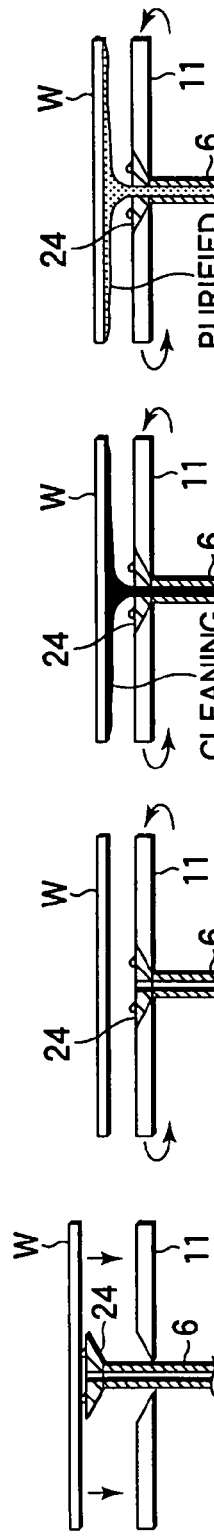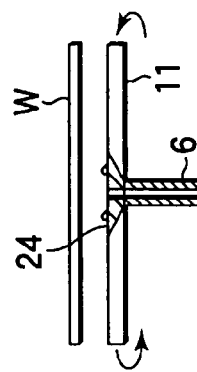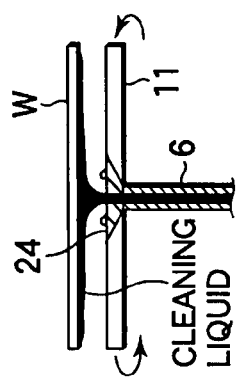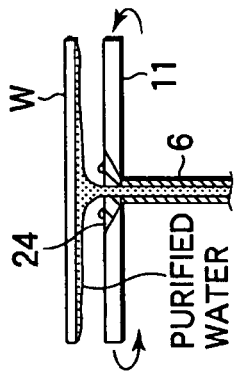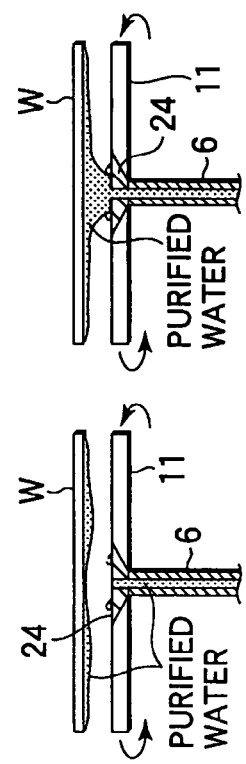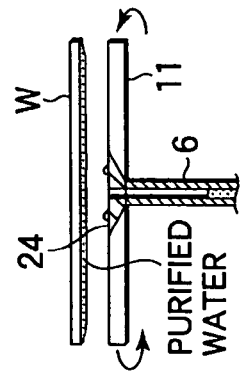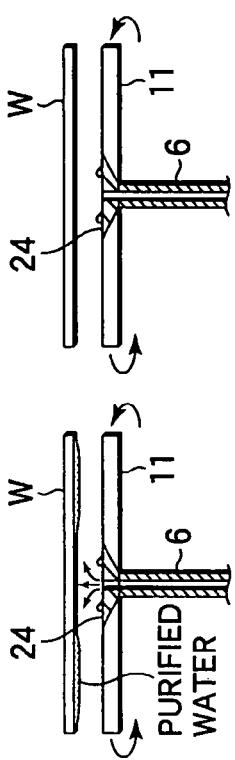

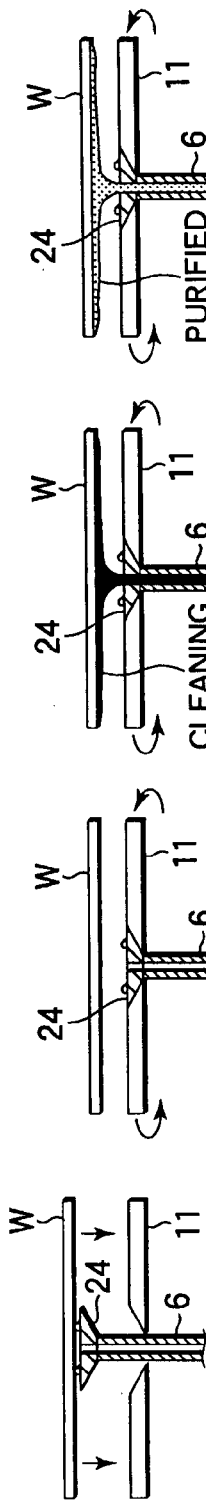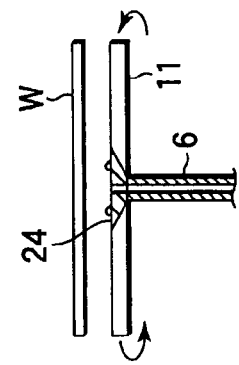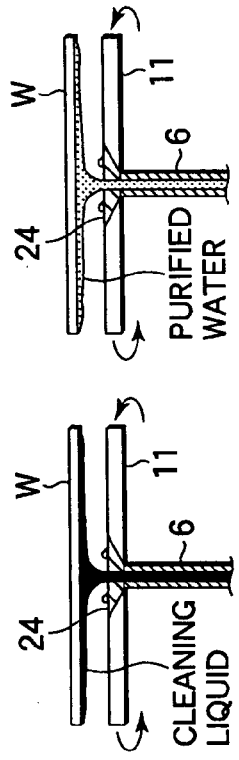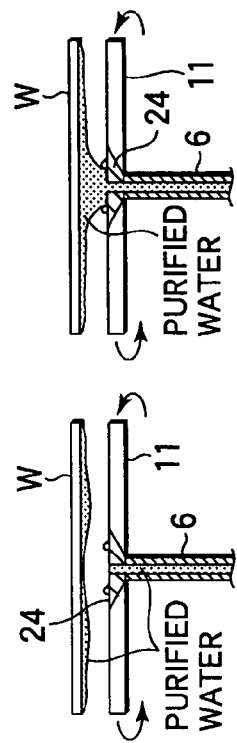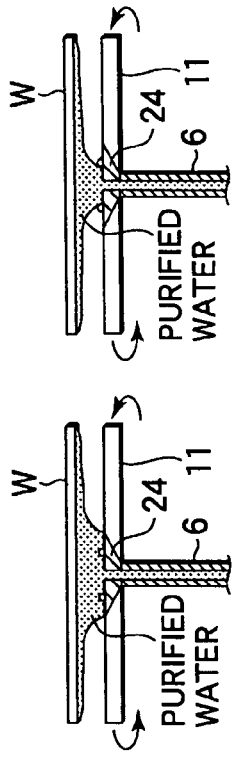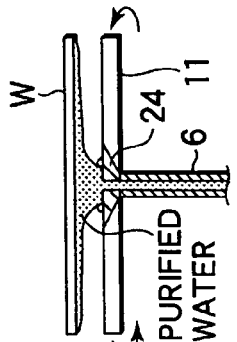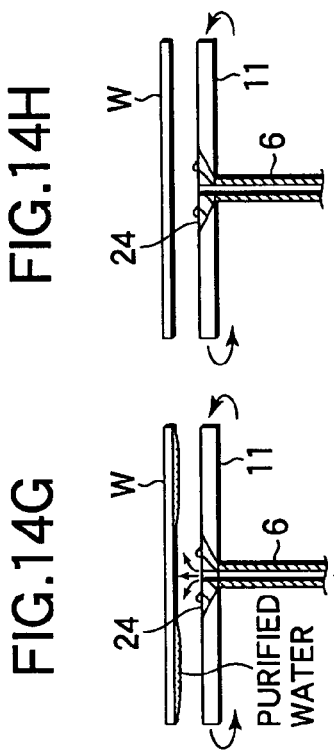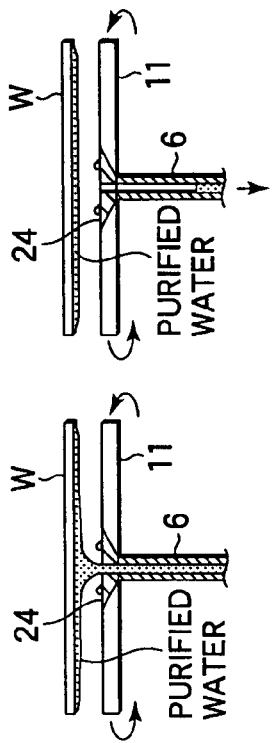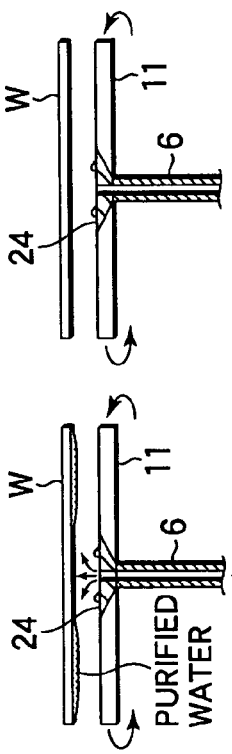

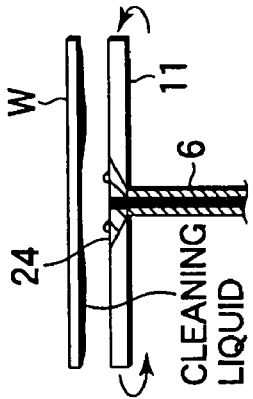
FIG.16A
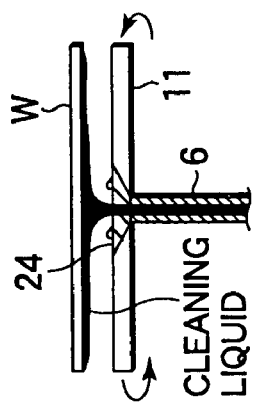
FIG.16B
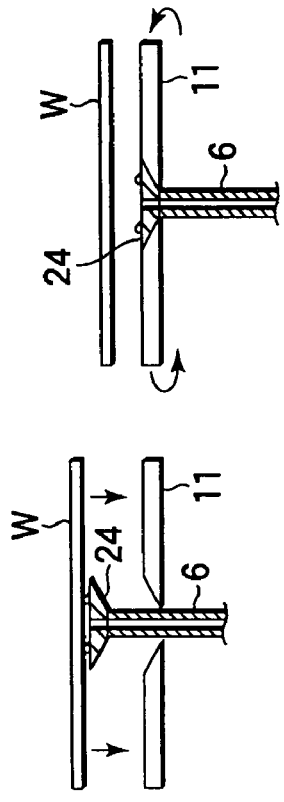
FIG.16C
FIG.16D
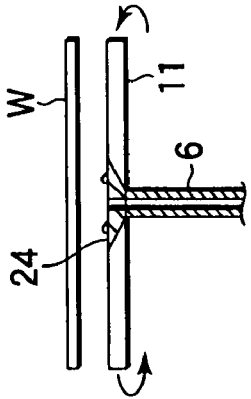
FIG.16E
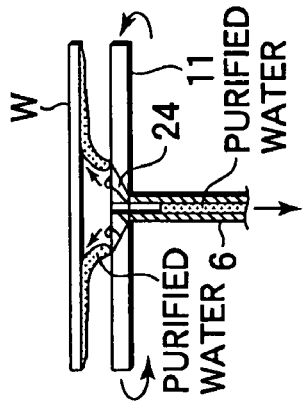
FIG.16F
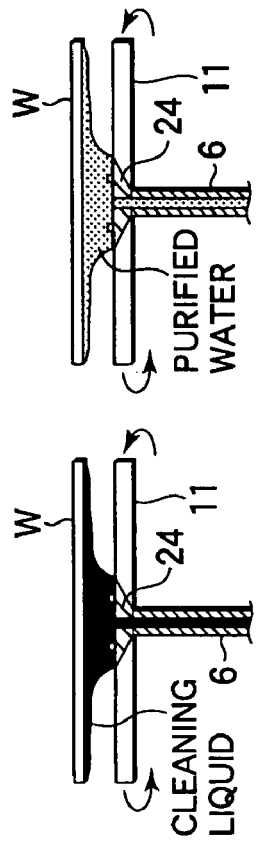
FIG.16G
FIG.16H

CLEANING APPARATUS AND METHOD AND COMPUTER READABLE MEDIUM

BACKGROUND OF THE INVENTION

1. Field of the Invention

The present invention relates to a cleaning apparatus and method and a computer readable medium, for performing a cleaning process on a substrate, such as a semiconductor wafer.

2. Description of the Related Art

In the process of manufacturing semiconductor devices or flat panel display devices (FPD), liquid processes are frequently used, in which a process liquid is supplied onto a target substrate, such as a semiconductor wafer or glass substrate. For example, processes of this kind encompass a cleaning process for removing particles and/or contaminants deposited on a substrate.

As a liquid processing apparatus used for this purpose, the following apparatus of the single-substrate processing type is known. Specifically, a substrate, such as a semiconductor wafer, is held in a rotatable state, and a process liquid is supplied onto the front surface, back surface, or front and back surfaces of the wafer, while the wafer is rotated. Consequently, a liquid film is formed on the front surface, back surface, or front and back surfaces of the wafer, thereby performing a process.

As a apparatus for performing a cleaning process while forming a liquid film on the back surface or front and back surfaces of a substrate, the following apparatus is known (for example, Jpn. Pat. Appln. KOKAI Publication No. 9-298181). Specifically, a rotatable rotary plate is disposed below the back surface of the substrate. The rotary plate has an opening at the center, which is provided with a non-rotatable liquid delivery plate having a substrate support function and a liquid delivery port. The liquid delivery plate is movable up and down such that the liquid delivery plate receives the substrate in a state projected upward and then is moved down to place the substrate in a horizontal state on holding accessories provided on the rotary plate. A cleaning liquid or rinsing liquid is supplied from a liquid delivery nozzle, which extends downward from the liquid delivery port, into a gap between the substrate and rotary plate to form a liquid film. In this state, cleaning is performed on the back surface of the substrate.

The liquid delivery plate surrounding the liquid delivery port may be contaminated with a chemical solution scattered thereon during a process. Further, the liquid delivery plate may be contaminated when an unprocessed substrate carrying contaminants comes into contact therewith. If a portion around the liquid delivery port is contaminated, this contaminated portion may touch and contaminate the back surface of the substrate after cleaning, when the substrate is supported by the liquid delivery plate for unloading. Accordingly, it is preferable to clean the liquid delivery plate when the substrate is processed. However, the liquid delivery port is non-rotatable in general, and the liquid delivery plate around the liquid delivery port is also non-rotatable. Hence, a liquid film cannot be sufficiently formed on the liquid delivery plate during a cleaning process or rinsing process, resulting in insufficient cleaning.

BRIEF SUMMARY OF THE INVENTION

An object of the present invention to provide a cleaning apparatus and method, which can sufficiently perform cleaning on the portion around a liquid delivery port located at the center of the back surface of a substrate, when cleaning is performed on the back surface of the substrate. Another object of the present invention is to provide a computer readable medium that stores a control program for executing the cleaning method.

According to a first aspect of the present invention, there is provided a cleaning apparatus comprising: a substrate holding member including a rotary plate configured to rotate in a horizontal state and a holding accessory configured to hold a substrate above the rotary plate in a horizontal state to be separated from and integrated with the rotary plate; a rotation mechanism configured to rotate the rotary plate along with the substrate; a liquid delivery port located near a rotational center of the rotary plate and configured to delivery a liquid onto a center of a back surface of the substrate held on the holding member; a back surface liquid supply nozzle connected to the liquid delivery port and configured to supply a cleaning liquid and a rinsing liquid to delivery the cleaning liquid and the rinsing liquid through the liquid delivery port onto the back surface of the substrate; a cup configured to surround the substrate held on the substrate holding member; and a control mechanism configured to control rotation of the substrate and supply of the liquids, wherein the control mechanism is preset to control the apparatus to perform a cleaning process that comprises rotating the rotary plate along with the substrate held by the holding accessory, while delivering the cleaning liquid from the back surface liquid supply nozzle through the delivery port, thereby forming a liquid film of the cleaning liquid on the back surface of the substrate, then sequentially perform a rinsing process that comprises rotating the substrate, while delivering the rinsing liquid from the back surface liquid supply nozzle through the liquid delivery port, thereby forming a liquid film of the rinsing liquid on the back surface of the substrate, and then perform a throwing off and drying process that comprises rotating the substrate at predetermined rotation speed, and wherein the control mechanism is further preset to control the apparatus for the cleaning process or the rinsing process to comprise delivering a process liquid, which is corresponding one of the cleaning liquid and the rinsing liquid, from the back surface liquid supply nozzle through the liquid delivery port, thereby forming a liquid film on the back surface of the substrate, and then once stopping and then re-starting delivery of the process liquid from the back surface liquid supply nozzle, thereby forming a liquid film also on a portion around the liquid delivery port, so as to process the portion around the liquid delivery port as well as the substrate.

According to a second aspect of the present invention, there is provided a cleaning method performed in a cleaning apparatus comprising a substrate holding member including a rotary plate configured to rotate in a horizontal state and a holding accessory configured to hold a substrate above the rotary plate in a horizontal state to be separated from and integrated with the rotary plate, a rotation mechanism configured to rotate the rotary plate along with the substrate, a liquid delivery port located near a rotational center of the rotary plate and configured to delivery a liquid onto a center of a back surface of the substrate held on the holding member, a back surface liquid supply nozzle connected to the liquid delivery port and configured to supply a cleaning liquid and a rinsing liquid to delivery the cleaning liquid and the rinsing liquid through the liquid delivery port onto the back surface of the substrate, and a cup configured to surround the substrate held on the substrate holding member, the method comprising: holding the substrate on the substrate holding member; rotating the rotary plate along with the substrate held thereon; performing a cleaning process that comprises rotating the substrate, while delivering the cleaning liquid from the back surface liquid supply nozzle through the delivery port, thereby forming a liquid film of the cleaning liquid on the back surface of the substrate; then sequentially performing a rinsing process that comprises rotating the substrate, while delivering the rinsing liquid from the back surface liquid supply nozzle through the liquid delivery port, thereby forming a liquid film of the rinsing liquid on the back surface of the substrate; and then performing a throwing off and drying process that comprises rotating the substrate at predetermined rotation speed, wherein the cleaning process or the rinsing process comprises delivering a process liquid, which is corresponding one of the cleaning liquid and the rinsing liquid, from the back surface liquid supply nozzle through the liquid delivery port, thereby forming a liquid film on the back surface of the substrate, and then once stopping and then re-starting delivery of the process liquid from the back surface liquid supply nozzle, thereby forming a liquid film also on a portion around the liquid delivery port, so as to process the portion around the liquid delivery port as well as the substrate.

According to a third aspect of the present invention, there is provided a computer readable medium that stores a computer program for execution on a processor used for a cleaning apparatus comprising a substrate holding member including a rotary plate configured to rotate in a horizontal state and a holding accessory configured to hold a substrate above the rotary plate in a horizontal state to be separated from and integrated with the rotary plate, a rotation mechanism configured to rotate the rotary plate along with the substrate, a liquid delivery port located near a rotational center of the rotary plate and configured to delivery a liquid onto a center of a back surface of the substrate held on the holding member, a back surface liquid supply nozzle connected to the liquid delivery port and configured to supply a cleaning liquid and a rinsing liquid to delivery the cleaning liquid and the rinsing liquid through the liquid delivery port onto the back surface of the substrate, and a cup configured to surround the substrate held on the substrate holding member, the computer program, when executed by the processor, controlling the cleaning apparatus to perform a cleaning method comprising: holding the substrate on the substrate holding member; rotating the rotary plate along with the substrate held thereon; performing a cleaning process that comprises rotating the substrate, while delivering the cleaning liquid from the back surface liquid supply nozzle through the delivery port, thereby forming a liquid film of the cleaning liquid on the back surface of the substrate; then sequentially performing a rinsing process that comprises rotating the substrate, while delivering the rinsing liquid from the back surface liquid supply nozzle through the liquid delivery port, thereby forming a liquid film of the rinsing liquid on the back surface of the substrate; and then performing a throwing off and drying process that comprises rotating the substrate at predetermined rotation speed, wherein the cleaning process or the rinsing process comprises delivering a process liquid, which is corresponding one of the cleaning liquid and the rinsing liquid, from the back surface liquid supply nozzle through the liquid delivery port, thereby forming a liquid film on the back surface of the substrate, and then once stopping and then re-starting delivery of the process liquid from the back surface liquid supply nozzle, thereby forming a liquid film also on a portion around the liquid delivery port, so as to process the portion around the liquid delivery port as well as the substrate.

In the first to third aspect, the control may comprise adjusting a delivery rate of the process liquid used when re-starting delivery of the process liquid to be smaller than that used before once stopping delivery of the process liquid. The control may comprise discharging the process liquid left inside the back surface liquid supply nozzle after finishing a process using the process liquid. Where the process liquid is the rinsing liquid, and the back surface of the substrate is hydrophobic, the rinsing process may comprise stopping delivery of the process liquid and discharging the process liquid left inside the back surface liquid supply nozzle, after re-starting delivery of the process liquid. Where the process liquid is the rinsing liquid, and the back surface of the substrate is hydrophilic, the rinsing process may comprise adjusting a delivery rate of the process liquid used when re-starting delivery of the process liquid to be smaller than that used before once stopping delivery of the process liquid, and then increasing a delivery rate of the process liquid. The control may comprise supplying a drying gas onto the center of the back surface of the substrate by a drying gas supply mechanism before the throwing off and drying process.

In the first to third aspect, where the process liquid is the rinsing liquid, the rinsing process may comprise adjusting a delivery rate of the process liquid used when re-starting delivery of the process liquid to be smaller than that used before once stopping delivery of the process liquid, thereby forming a liquid film on the portion around the liquid delivery port, then increasing a delivery rate of the process liquid, thereby processing the portion around the liquid delivery port as well as the substrate, then decreasing a delivery rate of the process liquid, and then stopping delivery of the process liquid, and the control may comprise supplying a drying gas onto the center of the back surface of the substrate by a drying gas supply mechanism before the throwing off and drying process.

In the first to third aspect, the rotary plate may have an opening at a center, and the cleaning apparatus may further comprise a non-rotatable liquid delivery plate disposed in the opening and having the liquid delivery port. The liquid delivery plate may be movable up and down through the opening, and configured to move up and down while supporting the substrate to transfer the substrate from and to the substrate holding member. The liquid delivery plate may have an upper surface made of a hydrophobic material. The control may comprise setting a rotation speed of the substrate to be 200 to 700 rpm in the cleaning process and the rinsing process, and to be 500 to 1,200 rpm in the throwing off and drying process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 10A to 10I are schematic views for explaining the operation of the cleaning method according to the second embodiment of the present invention;

FIGS. 12A to 12J are schematic views for explaining the operation of the cleaning method according to the third embodiment of the present invention;

FIGS. 14A to 14L are schematic views for explaining the operation of the cleaning method according to the fourth embodiment of the present invention;

FIGS. 16A to 16H are schematic views for explaining the operation of the cleaning method according to the fifth embodiment of the present invention;

DETAILED DESCRIPTION OF THE INVENTION

Embodiments of the present invention will now be described with reference to the accompanying drawings. Hereinafter, an explanation will be given of a case where the present invention is applied to a liquid processing apparatus that can perform a cleaning process on the front and back surfaces of a semiconductor wafer (which will be simply referred to as "wafer", hereinafter).

Figure 1:
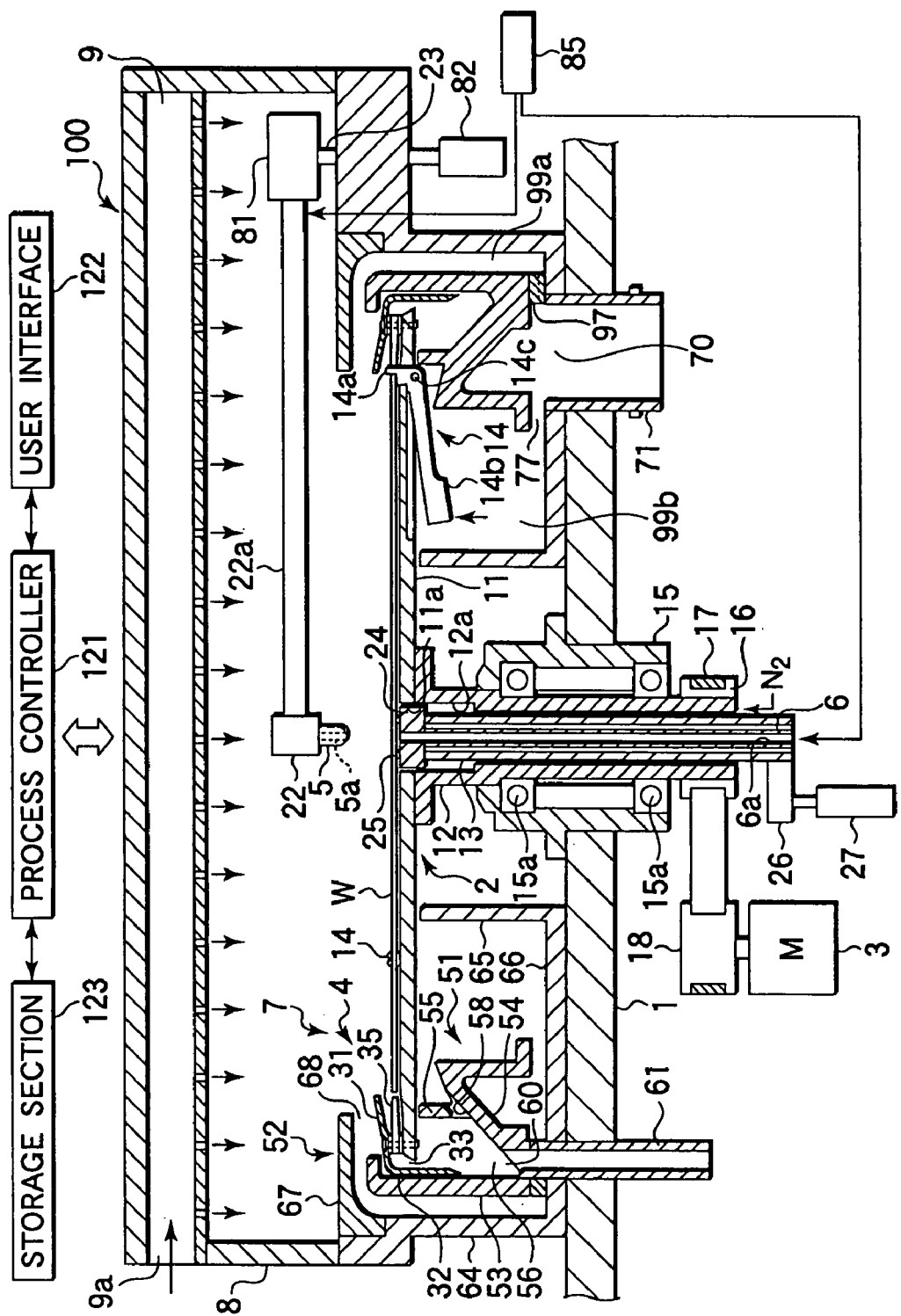
FIG. 1 is a sectional view schematically showing the structure of a cleaning apparatus according to an embodiment of the present invention.
Figure 2:
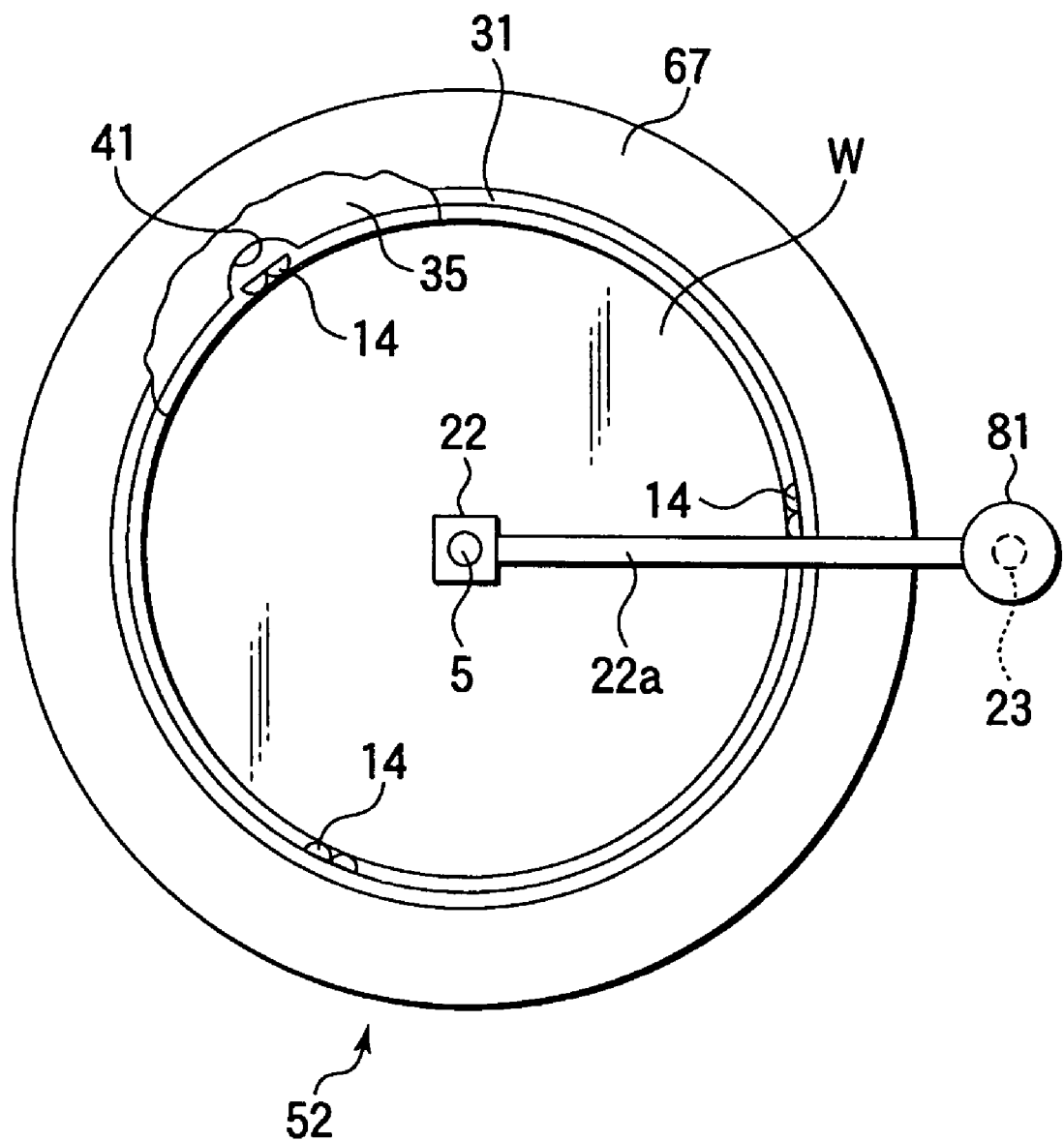
FIG. 2 is a partially sectional plan view schematically showing the cleaning apparatus according to the embodiment of the present invention.
Figure 3:
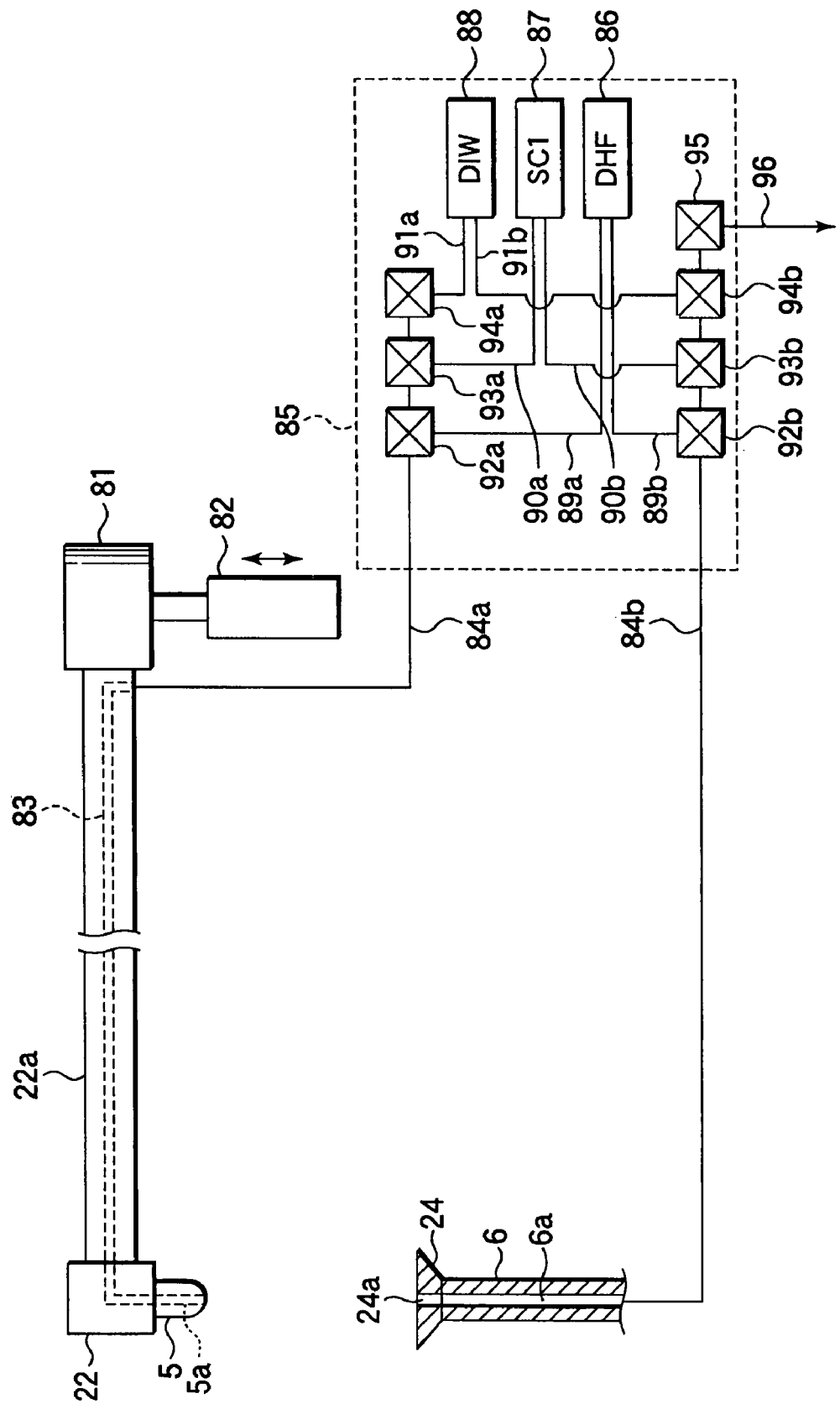
FIG. 3 is a view schematically showing a liquid supply mechanism used in the cleaning apparatus shown in FIG. 1.
Figure 4:
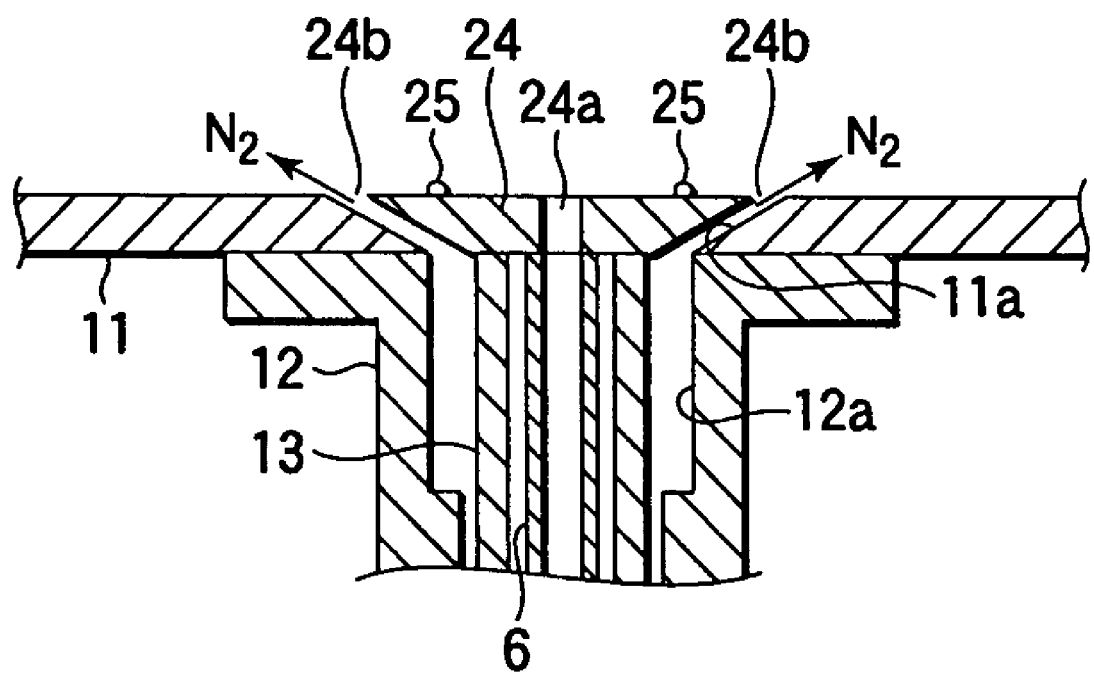
FIG. 4 is an enlarged sectional view showing an area including a liquid delivery plate used in the cleaning apparatus shown in FIG. 1.
Figure 5:
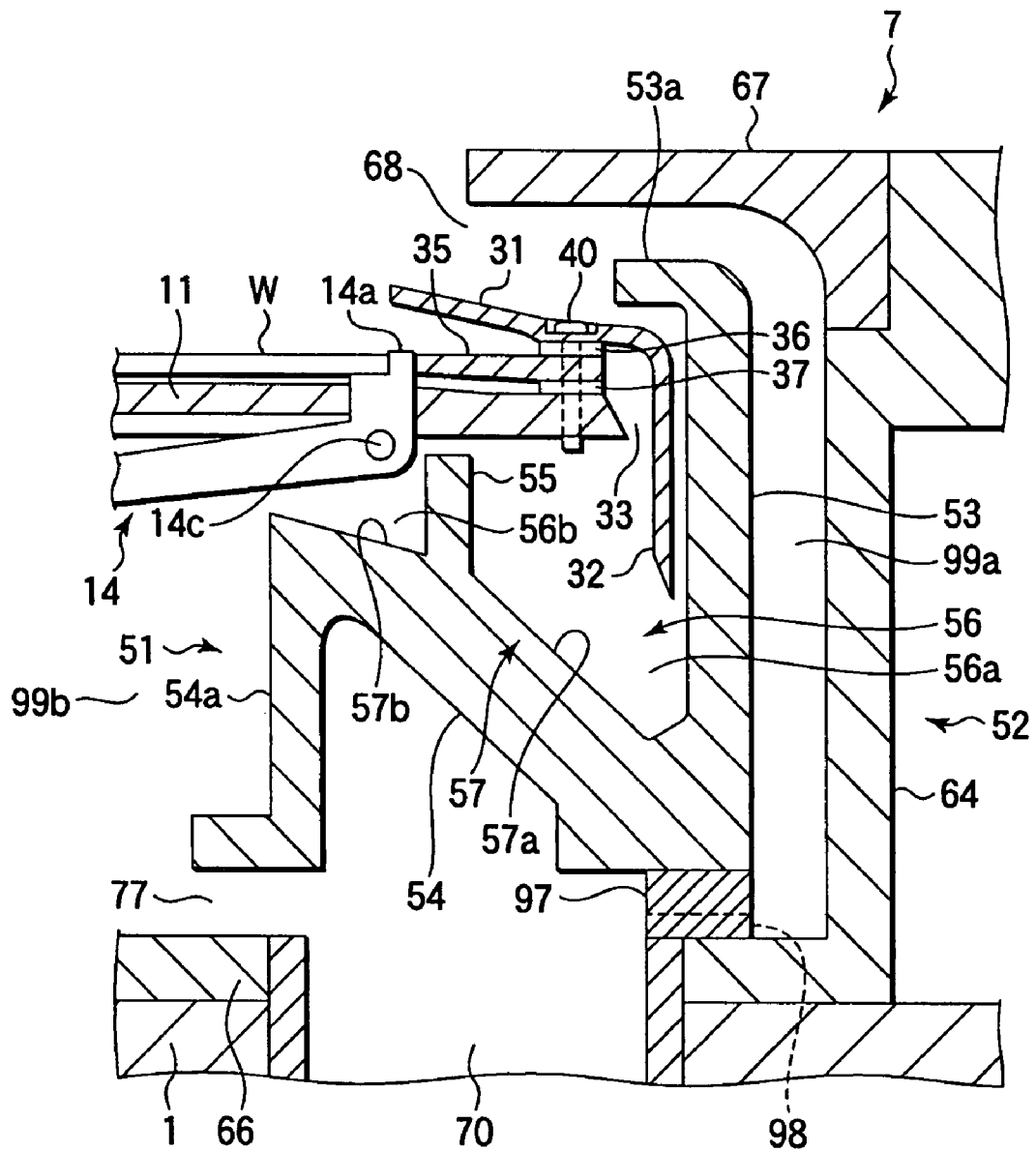
FIG. 5 is an enlarged sectional view showing an exhaust/drain section used in the cleaning apparatus shown in FIG. 1.

FIG. 1 is a sectional view schematically showing the structure of a cleaning apparatus according to an embodiment of the present invention. FIG. 2 is a plan view of the cleaning apparatus. FIG. 3 is a view schematically showing a liquid supply mechanism for a cleaning liquid and a rinsing liquid used in the cleaning apparatus shown in FIG. 1. FIG. 4 is an enlarged sectional view showing an area including a liquid delivery plate used in the cleaning apparatus shown in FIG. 1. FIG. 5 is an enlarged sectional view showing an exhaust/drain section used in the cleaning apparatus shown in FIG. 1.

A liquid processing system (not shown) contains a plurality of apparatuses disposed therein, each of which is the same as this cleaning apparatus 100. This cleaning apparatus 100 includes a base plate 1 and a wafer holding member 2 for rotatably holding a target substrate or wafer W. The wafer holding member 2 is rotatable by a rotary motor 3. A rotary cup 4 is disposed around the wafer W held on the wafer holding member 2 and configured to rotate along with the wafer holding member 2. The cleaning apparatus 100 further includes a front surface liquid supply nozzle 5 for supplying a process liquid onto the front surface of the wafer W, and a back surface liquid supply nozzle 6 for supplying a process liquid onto the back surface of the wafer W. Further, an exhaust/drain section 7 is disposed around the rotary cup 4. A casing 8 is disposed to cover the area around the exhaust/drain section 7 and the area above the wafer W. The casing 8 is provided with a gas flow inlet section 9 at the top arranged to receive, through an inlet port 9a formed on a lateral side, a gas flow supplied from a fan/filter unit (FFU) of the liquid processing system, so that clean air is supplied as a down flow onto the wafer W held on the wafer holding member 2.

The wafer holding member 2 includes a rotary plate 11 formed of a circular plate set in a horizontal state. The center of the bottom of the rotary plate 11 is connected to a cylindrical rotary shaft 12 extending vertically-downward. The rotary plate 11 has an opening 11a at the center, which communicates with a bore 12a formed inside the rotary shaft 12. The back surface liquid supply nozzle 6 is vertically formed at the center in an elevating member 13, which is movable up and down through the bore 12a and opening 11a. As shown in FIG. 2, the rotary plate 11 is provided with three holding accessories 14 disposed at regular intervals for holding the outer edge of the wafer W. The holding accessories 14 are configured to hold the wafer W in a horizontal state such that the wafer W is slightly separated from the rotary plate 11. Each of the holding accessories 14 includes a holding portion 14a configured to hold the edge of the wafer W, an operation lever 14b extending from the holding portion 14a toward the center of the lower surface of the rotary plate, and a pivot shaft 14c that supports the holding portion 14a to be vertically rotatable. When the distal end of the operation lever 14b is pushed up by a cylinder mechanism (not shown), the holding portion 14a is rotated outward and cancels the hold on the wafer W. Each holding accessory 14 is biased by a spring (not shown) toward a direction for the holding portion 14a to hold the wafer W, so that the holding accessory 14 can hold the wafer W when the cylinder mechanism does not act thereon.

The rotary shaft 12 is rotatably supported by the base plate 1 through a bearing mechanism 15 having two bearings 15a. The rotary shaft 12 is provided with a pulley 16 fitted thereon at the lower end. The shaft of the motor 3 is also provided with a pulley 18 fitted thereon. A belt 17 is wound around between these pulleys 16 and 18. The rotary shaft 12 is rotated through the pulley 18, belt 17, and pulley 16 by rotation of the motor 3.

The front surface liquid supply nozzle 5 is attached to a nozzle holding member 22 supported on the distal end of a nozzle arm 22a. A process liquid or the like is supplied from a process liquid supply mechanism 85 described later through a flow passage formed in the nozzle arm 22a, and is then delivered from a nozzle hole 5a formed in the nozzle 5.

As shown in FIG. 2, the nozzle arm 22a is rotatable by a driving mechanism 81 about a shaft 23 used as a central axis to move the front surface liquid supply nozzle 5 between wafer cleaning positions above the center and periphery of the wafer W and a retreat position outside the wafer W. Further, the nozzle arm 22a is movable up and down by an elevating mechanism 82, such as a cylinder mechanism.

As shown in FIG. 3, the nozzle arm 22a has a flow passage 83 formed therein and connected at one end to the nozzle hole 5a of the front surface liquid supply nozzle 5. The other end of the flow passage 83 is connected to a line 84a, which is in turn connected to a liquid supply mechanism 85. A predetermined liquid is supplied from the liquid supply mechanism 85 through the line 84a and flow passage 83 into the front surface liquid supply nozzle 5.

The back surface liquid supply nozzle 6 has a nozzle hole 6a formed through the center of the elevating member 13 and extending in the longitudinal direction. The lower end of the nozzle hole 6a is connected to a line 84b, which is in turn connected to the liquid supply mechanism 85. A predetermined liquid is supplied from the liquid supply mechanism 85 through the line 84b into the back surface liquid supply nozzle 6.

The liquid supply mechanism 85 includes cleaning chemical solution sources, such as a DHF supply source 86 for supplying dilute hydrofluoric acid (DHF) as an acidic chemical solution and an SC1 supply source 87 for supplying ammonia hydrogen peroxide solution (SC1) as an alkaline chemical solution. The liquid supply mechanism 85 further includes a DIW supply source 88 for supplying purified water (DIW) as a rinsing liquid. The DHF supply source 86, SC1 supply source 87, and DIW supply source 88 are connected to lines 89a, 90a, and 91a extending therefrom. The lines 89a, 90a, and 91a are connected to the line 84a through switching valves 92a, 93a, and 94a. Accordingly, ammonia hydrogen peroxide solution (SC1), dilute hydrofluoric-acid (DHF), and purified water (DIW) are selectively supplied into the front surface liquid supply nozzle 5 by operating the switching valves 92a, 93a, and 94a.

The DHF supply source 86, SC1 supply source 87, and DIW supply source 88 are also connected to lines 89b, 90b, and 91b extending therefrom. The lines 89b, 90b, and 91b are connected to the line 84b through switching valves 92b, 93b, and 94b. Accordingly, ammonia hydrogen peroxide solution (SC1), dilute hydrofluoric acid (DHF), and purified water (DIW) are selectively supplied into the back surface liquid supply nozzle 6 by operating the switching valves 92b, 93b, and 94b. The line 84b is connected to a switching valve 95 downstream from the switching valve 92b. The switching valve 95 is connected to a discharge line 96. The discharge line 96 is used for discharging liquid inside the nozzle hole 6a by the liquid's own weight or suction of an aspirator or the like.

The lines 91a and 91b extending from the DIW supply source 88 are connected to the most upstream side of the lines 84a and 84b.

As shown in the enlarged view of FIG. 4, the elevating member 13 is connected to a liquid delivery plate 24 at the top, which has a liquid delivery port 24a for delivering liquid formed at the center and communicating with the nozzle hole 6a of the back surface liquid supply nozzle 6. The liquid delivery plate 24 is provided with three wafer support pins 25 for supporting the wafer W (only two of them are shown) on the upper surface. The liquid delivery plate 24 is formed of a frustum of a cone flared upward, which is retreated inside the opening 11a during processes, as shown in FIG. 4, so that the upper surface thereof is essentially leveled with the upper surface of the rotary plate 11. The opening 11a is also shaped to define a frustum of a cone corresponding to the liquid delivery plate 24. A gap 24b is formed between the rotary plate 11 and liquid delivery plate 24, so that $N_2$ gas supplied from below the rotary shaft 12 flows through the gap between the rotary shaft 12 and elevating member 13 and is spouted through the gap 24b onto the back surface of the wafer W. Consequently, liquid is prevented from entering the inside of the rotary shaft 12.

The lower end of the elevating member 13 is connected to a cylinder mechanism 27 through a connector 26. The elevating member 13 is moved up and down by the cylinder mechanism 27 to move the wafer W up and down, thereby loading and unloading the wafer W.

The rotary cup 4 includes an annular eaves portion 31 inclined to extend inward and upward from a position above the end of the rotary plate 11 and a cylindrical outer wall portion 32 extending vertically downward from the outer end of the eaves portion 31. As shown in the enlarged view of FIG. 5, an annular gap 33 is formed between the outer wall portion 32 and rotary plate 11, so that a cleaning liquid or rinsing liquid scattered by rotation of the wafer W along with the rotary plate 11 and rotary cup 4 is guided downward through the gap 33.

A plate-like guide member 35 is disposed between the eaves portion 31 and rotary plate 11 at a height essentially the same as the wafer W. Openings 36 and 37 are formed between the eaves portion 31 and guide member 35 and between the guide member 35 and rotary plate 11 to allow a cleaning liquid or rinsing liquid to pass therethrough. The openings 36 and 37 are defined by a plurality of spacers (not shown) disposed in an annular direction between the eaves portion 31 and guide member 35 and between the guide member 35 and rotary plate 11. The eaves portion 31, guide member 35, rotary plate 11, and spacers are fixed to each other by screws 40 (see FIG. 5).

The guide member 35 is arranged such that the upper and lower surfaces thereof are to be almost continued to the front and back surfaces of the wafer W. When a process liquid is supplied onto the center of the front surface of the wafer W from the front surface liquid supply nozzle 5 while the wafer holding member 2 and rotary cup 4 are rotated along with the wafer W by the motor 3, the process liquid is spread by a centrifugal force on the front surface of the wafer W and is thrown off from the peripheral edge of the wafer W. The process liquid thus thrown off from the front surface of the wafer W is guided by the upper surface of the guide member 35 almost continued thereto. Then, the process liquid is discharged outward through the openings 36, and is guided downward by the outer wall portion 32. Similarly, when a process liquid is supplied onto the center of the back surface of the wafer W from the back surface liquid supply nozzle 6 while the wafer holding member 2 and rotary cup 4 are rotated along with the wafer W, the process liquid is spread by a centrifugal force on the back surface of the wafer W and is thrown off from the peripheral edge of the wafer W. The process liquid thus thrown off from the back surface of the wafer W is guided by the lower surface of the guide member 35 almost continued thereto. Then, the process liquid is discharged outward through the openings 37, and is guided downward by the outer wall portion 32. At this time, since a centrifugal force acts on the process liquid on the outer wall portion 32, mist of the process liquid is inhibited from returning inward.

Further, since the process liquid thrown off from the front and back surfaces of the wafer W is guided by the guide member 35, the process liquid separated from the peripheral edge of the wafer W can hardly become turbulent. In this case, it is possible to guide the process liquid out of the rotary cup 4 while preventing the process liquid from being turned into mist. As shown in FIG. 2, the guide member 35 has notches 41 at positions corresponding to the wafer holding accessories 14 to accept the wafer holding accessories 14.

The exhaust/drain section 7 is mainly used for collecting exhaust gas and drainage discharged from the space surrounded by the rotary plate 11 and rotary cup 4. As shown in the enlarged view of FIG. 5, the exhaust/drain section 7 includes an annular drain cup 51 disposed to receive a cleaning liquid or rinsing liquid discharged from the rotary cup 4, and an annular exhaust cup 52 accommodating the drain cup 51 and disposed coaxially with the drain cup 51.

As shown in FIGS. 1 and 5, the drain cup 51 includes a vertical and cylindrical outer wall 53 disposed outside the rotary cup 4 adjacent to the outer wall portion 32, and an internal wall 54 extending inward from the lower end of the outer wall 53. The internal wall 54 is connected to a vertical inner wall 54a on the inner side. The outer wall 53 and internal wall 54 define an annular space used as a liquid receptacle 56 for receiving a cleaning liquid or rinsing liquid discharged from the rotary cup 4. The upper side of the outer wall 53 is formed as an extending portion 53a extending to a position above the rotary cup 4 to prevent a process liquid from bouncing out from the drain cup 51. The liquid receptacle 56 includes an annular partition wall 55 disposed therein in an annular direction of the drain cup 51 outside the holding accessories 14 and extending from the internal wall 54 to a position near the lower surface of the rotary plate 11. The liquid receptacle 56 is divided by the partition wall 55 into a main cup portion 56a and an auxiliary cup portion 56b. The main cup portion 56a is used for receiving liquid discharged from the gap 33, while the auxiliary cup portion 56b is used for receiving liquid dropping from portions near the holding portions 14a of the holding accessories 14. The bottom surface 57 of the liquid receptacle 56 is divided by the partition wall 55 into a first portion 57a corresponding to the main cup portion 56a and a second portion 57b corresponding to the auxiliary cup portion 56b. The first and second portions 57a and 57b are inclined upward and inward (toward the rotational center). The inner side of the second portion 57b extends inward (toward the rotational center) further from a position corresponding to the holding portions 14a of the holding accessories 14. The partition wall 55 serves to prevent stray winds, generated by the portions of the holding accessories 14 protruding downward below the rotary plate 11, from involving and transferring mist onto the wafer W. The partition wall 55 has a hole 58 formed therein to guide a process liquid from the auxiliary cup portion 56b to the main cup portion 56a (see FIG. 1).

The drain cup 51 has a drain port 60 for drainage from the liquid receptacle 56, which is formed in the internal wall 54 at one position on the outermost side and connected to a drain tube 61 (see FIG. 1). The drain tube 61 is connected to a drain-switching member (not shown), so that process liquids are separately collected or discarded in accordance with the types thereof. In place of a single drain port 60, a plurality of drain ports 60 may be formed.

The exhaust cup 52 includes an outer wall 64 vertically extending outside the outer wall 53 of the drain cup 51, and an inner wall 65 disposed on the inward side from the holding accessories 14 and vertically extending to have an upper end adjacent to the rotary plate 11. The exhaust cup 52 further includes a bottom wall 66 placed on the base plate 1, and an upper wall 67 extending upward and curved from the outer wall 64 to cover an area above the rotary cup 4. The exhaust cup 52 is mainly used for collecting and exhausting gas components from inside and around the rotary cup 4 through an annular inlet port 68 formed between the upper wall 67 and eaves portion 31 of the rotary cup 4. As shown in FIGS. 1 and 5, the exhaust cup 52 has exhaust ports 70 formed in the bottom and each connected to an exhaust tube 71. The exhaust tube 71 is connected to a suction mechanism (not shown) on the downstream side, so that gas is exhausted from around the rotary cup 4. The plurality of exhaust ports 70 can be selectively used by switching in accordance with the types of process liquids.

An outer annular space 99a is formed between the outermost wall or outer wall 53 of the drain cup 51 and the outer wall 64 of the exhaust cup 52. An annular gas flow adjusting member 97 is disposed between the bottom of the drain cup 51 and the bottom of the exhaust cup 52 outside the exhaust ports 70, and has a number of gas-flow holes 98 in an annular direction. The outer annular space 99a and gas flow adjusting member 97 serve to adjust the gas flow collected in the exhaust cup 52 and uniformly discharge it from the exhaust ports 70. Specifically, the gas flow is guided downward through the annular space or outer annular space 99a uniformly all over an annular direction, and is then supplied with a pressure loss or resistance by the gas flow adjusting member 97 having a number of gas-flow holes 98. Consequently, the gas flow is caused to be in a distributed state, so that it is relatively uniformly discharged to the exhaust ports 70 from all around, regardless of the distance from the exhaust ports 70.

Further, an inner annular space 99b is formed between the inner wall 54a of the drain cup 51 and the inner wall 65 of the exhaust cup 52. Gaps 77 are formed between the drain cup 51 and the exhaust cup 52 on the inner peripheral side of the drain cup 51. Gas components collected through the inlet port 68 slightly flow into the liquid receptacle 56 of the drain cup 51, as well as the outer annular space 99a. This gas flow is guided downward from the liquid receptacle 56 through the inner annular space 99b and the gaps 77 uniformly all over an annular direction, so that the gas flow is relatively uniformly discharged to the exhaust ports 70.

As described above, the liquid-draining from the drain cup 51 is performed independently of the gas-exhausting from the exhaust cup 52, so that drainage and exhaust gas are guided separately from each other. Further, since the exhaust cup 52 is disposed to surround the drain cup 51, mist leaked out of the drain cup 51 is swiftly discharged from the exhaust ports 70, so that the mist is reliably prevented from diffusing outside.

The substrate processing apparatus 100 includes a process controller 121 comprising a microprocessor (computer), and the respective components of the substrate processing apparatus 100 are connected to and controlled by the process controller 121. The process controller 121 is connected to a user interface 122 including, e.g. a keyboard and a display, wherein the keyboard is used for a process operator to input commands for operating the respective components of the substrate processing apparatus 100, and the display is used for showing visualized images of the operational status of the respective components of the substrate processing apparatus 100. Further, the process controller 121 is connected to a storage section 123 that stores recipes, i.e., control programs for the process controller 121 to control the substrate processing apparatus 100 so as to perform various processes, and control programs for the respective components of the liquid processing apparatus 100 to perform predetermined processes in accordance with process conditions. The recipes are stored in a storage medium included in the storage section 123. The storage medium may be formed of a hard disk or semiconductor memory, or a medium of the portable type, such as a CDROM, DVD, or flash memory. Alternatively, the recipes may be used online while they are transmitted from another apparatus through, e.g., a dedicated line, as needed.

A required recipe is retrieved from the storage section 123 and executed by the process controller 121 in accordance with an instruction or the like input through the user interface 122. Consequently, the substrate processing apparatus 100 can perform a predetermined process under the control of the process controller 121.

Next, an explanation will be given of a cleaning method performed in the substrate processing apparatus 100 having the structure described above.

Figure 6:
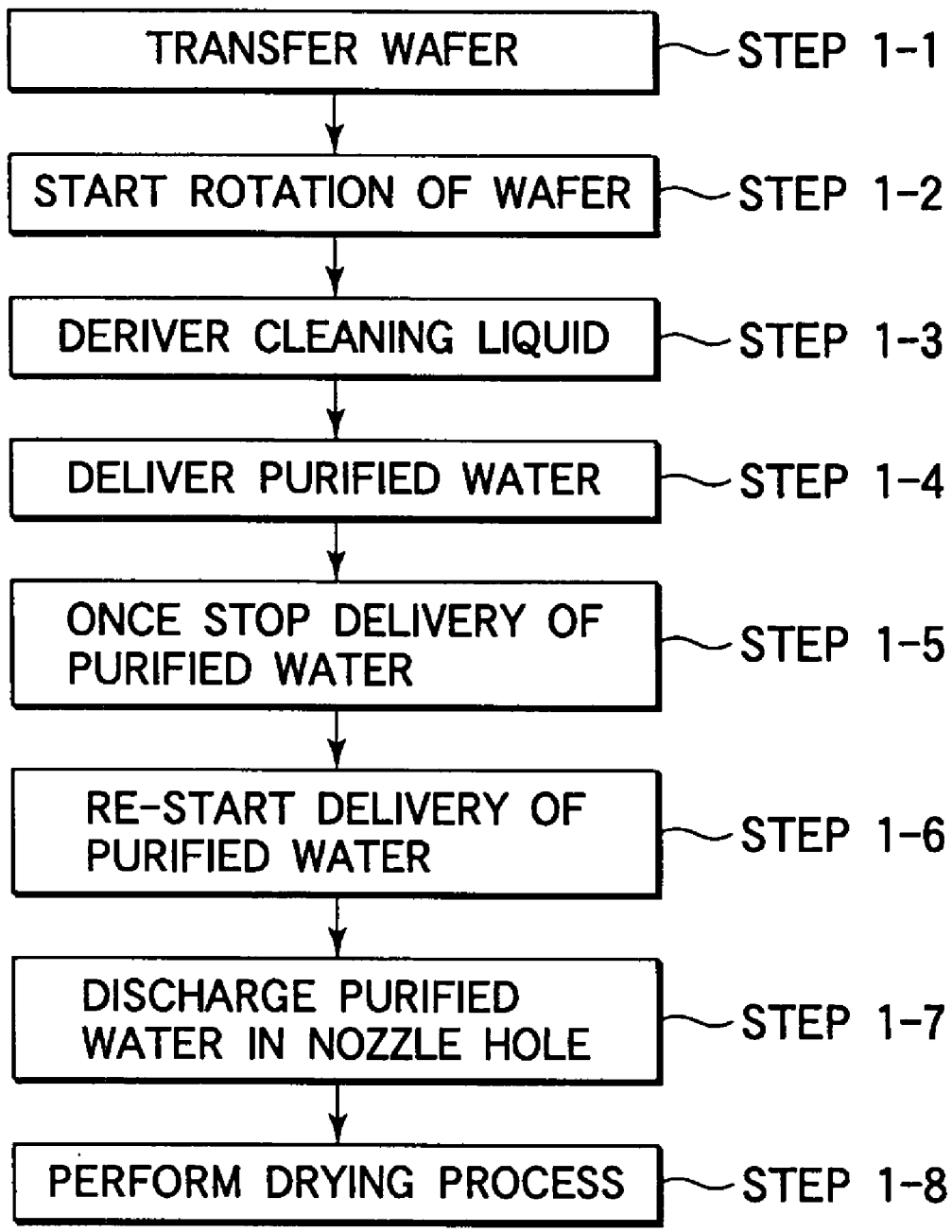
FIG. 6 is a flow chart showing the operational flow of a cleaning method according to a first embodiment of the present invention.

At first, a cleaning method according to a first embodiment will be explained with reference to the flow chart shown in FIG. 6 and the schematic views shown in FIGS. 7A to 7H. In this embodiment, cleaning is performed on the front and back surfaces of a wafer W by use of a cleaning liquid, and then cleaning is performed on the liquid delivery plate 24 when a rinsing process is performed. In this embodiment, the following operations for a cleaning process are controlled by the process controller 121 in accordance with a recipe stored in the storage section 123. The following explanation made with reference to FIGS. 6 and 7A to 7H are focused on cleaning performed on the back surface of the wafer W and cleaning performed on the liquid delivery plate 24. However, when a cleaning process using a cleaning liquid and a rinsing process using purified water are performed on the back surface of the wafer W, a cleaning process using a cleaning liquid and a rinsing process using purified water are also performed on the front surface of the wafer W.

Figure 7A:
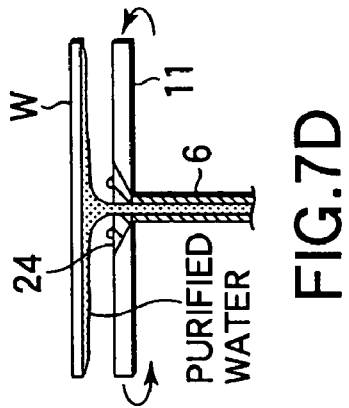
FIGS. 7A to 7H are schematic views for explaining the operation of the cleaning method according to the first embodiment of the present invention.

At first, the elevating member 13 is set at the upper position, and a wafer W is transferred from a transfer arm (not shown) onto the support pins 25 of the liquid delivery plate 24 (STEP 1-1 and FIG. 7A).

Then, the elevating member 13 is moved down, so that the liquid delivery plate 24 is set at a predetermined position inside the opening 11a of the rotary plate 11. Then, the wafer W is chucked by the holding accessories 14 in a state where a gap for forming a liquid film is formed between the wafer W and the rotary plate 11 and liquid delivery plate 24. Then, the wafer W is rotated along with the holding accessories 2 and rotary cup 4 (STEP 1-2 and FIG. 7B). At this time, the rotation speed of the wafer W is preferably set to be about 200 to 700 rpm.

Figure 7B:
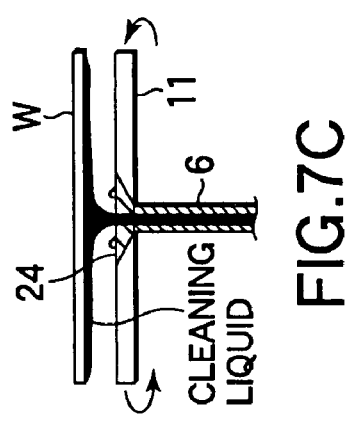
Figure 7C:
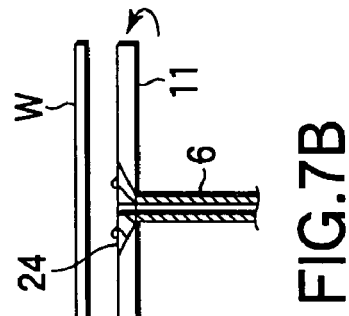

Then, while the wafer W is kept rotated, a predetermined cleaning liquid is delivered from the back surface liquid supply nozzle 6 onto the back surface of the wafer W (STEP 1-3 and FIG. 7C). At this time, a liquid film of the cleaning liquid is formed on the back surface of the wafer W. However, at the beginning, the back surface liquid supply nozzle 6 is not filled with liquid, so no liquid film is formed on the liquid delivery plate 24 when the cleaning liquid starts being delivered. In this step, the rotation speed of the wafer W of is preferably set to be 200 to 700 rpm, and the delivery rate of the cleaning liquid is preferably set to be 0.5 to 2.0 L/min.

Figure 7D:
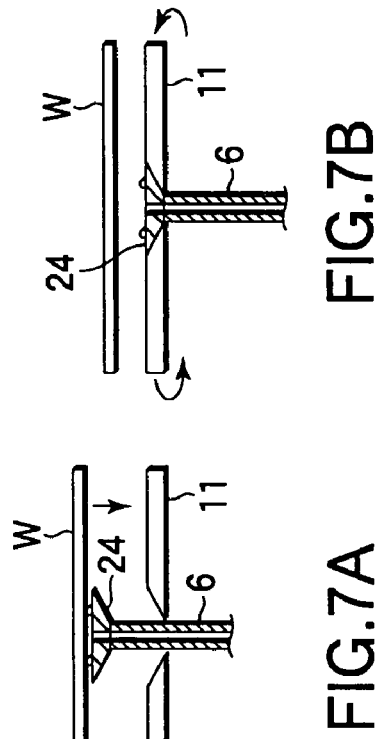
Figure 7E:
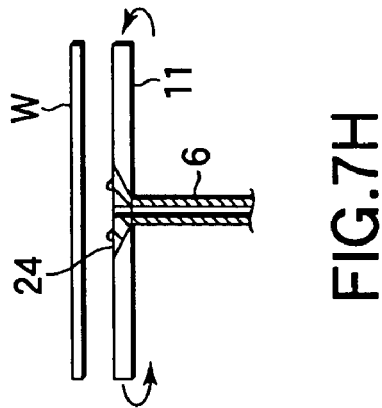
Figure 7F:
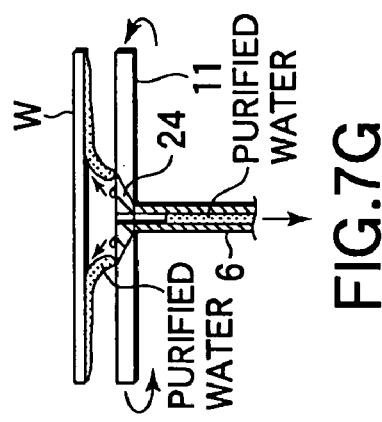

After the cleaning using the cleaning liquid is finished, the process liquid is switched in a continuous operation from the cleaning liquid to purified water used as a rinsing liquid to deliver the purified water (STEP 1-4 and FIG. 7D). At this time, the rotation speed of the wafer W is preferably set to be 200 to 1,000 rpm, and the delivery rate of purified water is preferably set to be 1.0 to 2.0 L/min. In this step, a liquid film is formed on the wafer W, but no liquid film is yet formed on the upper surface of the liquid delivery plate 24. Accordingly, delivery of the rinsing liquid or purified water is once stopped, so that the back surface liquid supply nozzle 6 is filled with the process liquid (STEP 1-5 and FIG. 7E).

In this state, delivery of the rinsing liquid or purified water is re-started, whereby a liquid film is formed on the upper surface of the liquid delivery plate 24. Consequently, the back surface of the wafer W is subjected to a rinsing process, and the upper surface of the liquid delivery plate 24 is subjected to cleaning by purified water (STEP 1-6 and FIG. 7F).

Figure 7G:
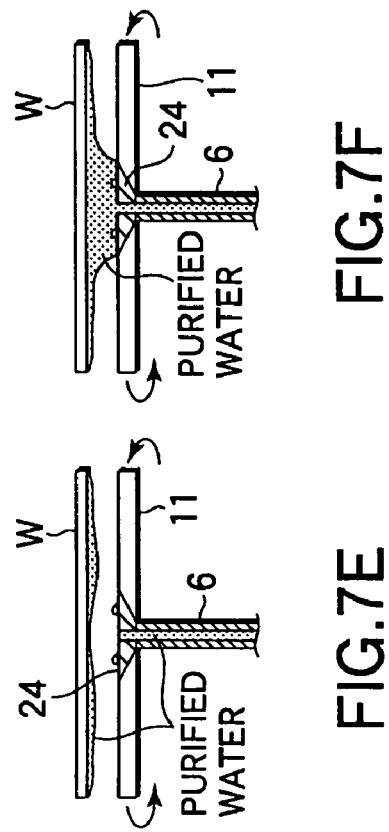

After the rinsing process is finished, the valve 95 is opened to discharge purified water in the nozzle hole 6a by the liquid's own weight or suction of an aspirator or the like (STEP 1-7 and FIG. 7G). This step is performed to remove the liquid from the upper surface of the rotary plate 11 as far as possible, and to prevent the liquid from being mixed with another liquid in the nozzle hole 6a.

Where at least the upper surface of the liquid delivery plate 24 is made of a hydrophobic material (for example, a fluorocarbon resin, such as Teflon™), no water droplets are left thereon when the rinsing process shown in FIG. 7G is finished, because purified water on the upper surface of the liquid delivery plate 24 has been thrown off along with purified water on the wafer W. Since the liquid delivery plate 24 is not rotated, if water droplets are left thereon, it is difficult to remove them by the following drying process. However, where the upper surface of the liquid delivery plate 24 is hydrophobic, no water droplets are left when the rinsing step is finished, so the wafer W is prevented from being contaminated with remaining water droplets deposited thereon.

Figure 7H:
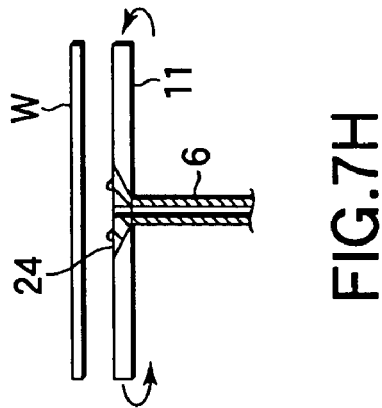

After the rinsing step, a throwing off and drying operation is performed on the wafer W while supply of the rinsing liquid or purified water is stopped (STEP 1-8 and FIG. 7H). At this time, the rotation speed of the wafer W is preferable set to be 500 to 1,200 rpm.

The first embodiment described above allows the liquid delivery plate 24 to be sufficiently cleaned by the rinsing liquid or purified water, so this embodiment is effective where the plate 24 should not be exposed to the cleaning liquid for a long time.

Although the liquid delivery plate 24 is cleaned by the first embodiment described above, the cleaning characteristic and/or drying characteristic differ depending on whether the back surface of the wafer W is hydrophobic or hydrophilic. Accordingly, the process steps are preferably modified depending on whether the back surface is hydrophobic or hydrophilic. Thus, preferable embodiments made in light of this matter will be explained.

Figure 8:
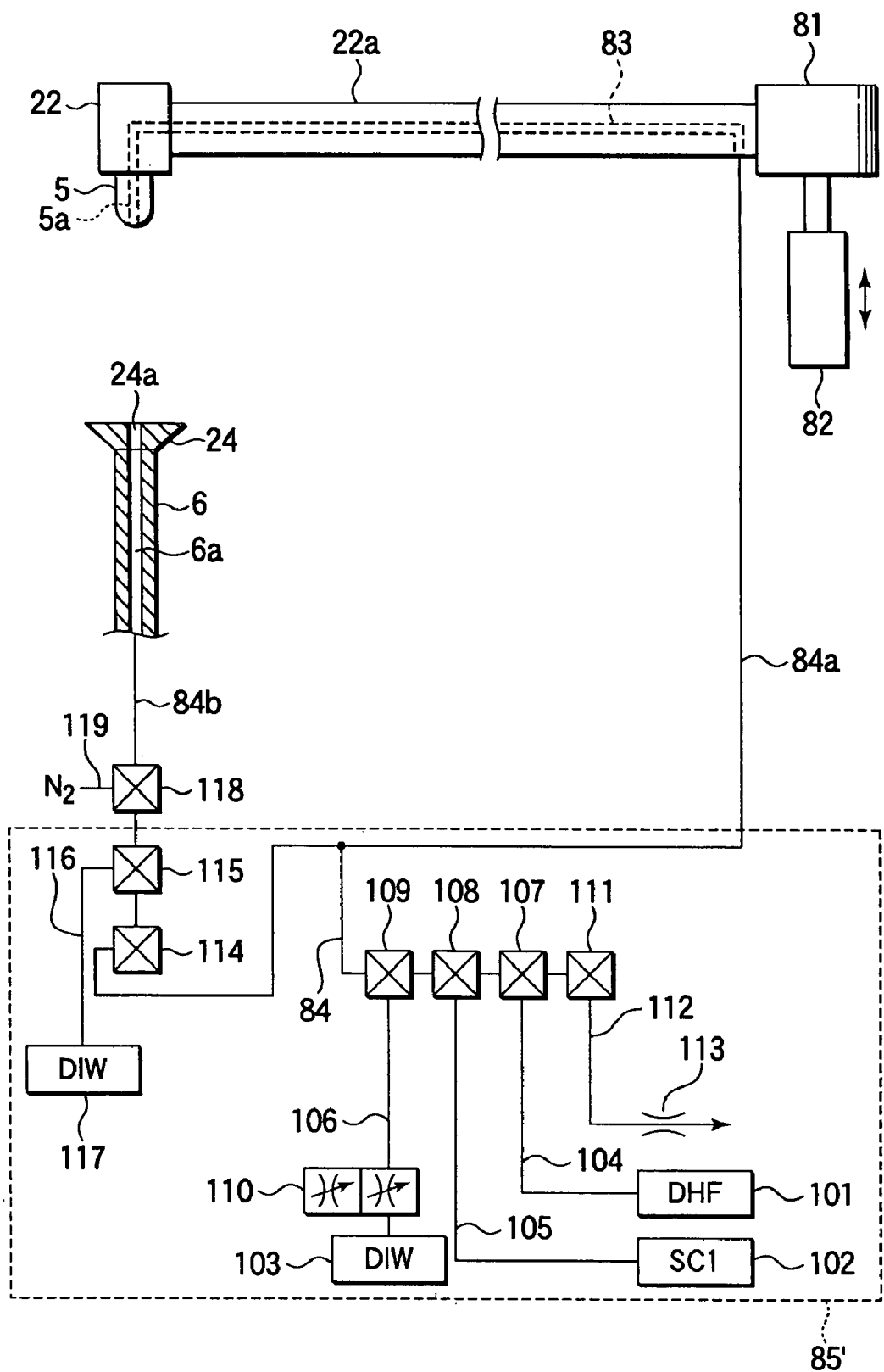
FIG. 8 is a view schematically showing the structure of an apparatus for performing preferable embodiments of the present invention.

At first, an explanation will be given of the structure of an apparatus for performing such preferable embodiments, with reference to FIG. 8. As shown in FIG. 8, the structures associated with the front surface liquid supply nozzle 5 and back surface liquid supply nozzle 6 are the same as those shown in FIG. 3. This modification mainly differs from FIG. 3, in a liquid supply mechanism 85' is used in place of the liquid supply mechanism 85 used in the first embodiment.

As shown in FIG. 8, the liquid supply mechanism 85' includes cleaning chemical solution sources, such as a DHF supply source 101 for supplying dilute hydrofluoric acid (DHF) as an acidic chemical solution and an SC1 supply source 102 for supplying ammonia hydrogen peroxide solution (SC1) as an alkaline chemical solution. The liquid supply mechanism 85' further includes a DIW supply source 103 for supplying purified water (DIW) as a rinsing liquid. The DHF supply source 101, SC1 supply source 102, and DIW supply source 103 are connected to lines 104, 105, and 106 extending therefrom. The lines 104, 105, and 106 are connected to the line 84 through switching valves 107, 108, and 109. The line 84 is connected to a line 84a communicating with a flow passage 83 of a nozzle arm 22a and line 84b communicating with the lower end of the nozzle hole 6a. Accordingly, ammonia hydrogen peroxide solution (SC1), dilute hydrofluoric acid (DHF), and purified water (DIW) are selectively supplied into the front surface liquid supply nozzle 5 and back surface liquid supply nozzle 6 by operating the switching valves 107, 108, and 109. The line 106 connected to the DIW supply source 103 is provided with a flow rate switching valve 110 for adjusting the flow rate of purified water. The line 84b is connected to a switching valve 111 downstream from the switching valve 107. The switching valve 111 is connected to a discharge line 112. The discharge line 112 is used for discharging liquid inside the nozzle hole 6a by the liquid's own weight (draining by its own weight). If the discharge rate of liquid discharged by its own-weight is too high, liquid droplets may be left inside the discharge line 112. In light of this problem, the discharge line 112 is provided with a fixed orifice 113, by which the discharge rate can be controlled.

The line 84b is provided with a shut-off valve 114 downstream from the connection point to the line 84. The shut-off valve 114 is used for shutting off the liquid supply to the back surface liquid supply nozzle 6 through the line 84. The line 84b is further provided with a switching valve 115 downstream from the shut-off valve 114. The switching valve 115 is connected to a line 116, which is in turn connected to a DIW supply source 117 for a small flow rate. The DIW supply source 117 for a small flow rate is used for supplying the line 84b with purified water through the line 116 at a flow rate smaller than that of purified water supplied from the DIW supply source 103 through the line 106. Specifically, when purified water is supplied into the back surface liquid supply nozzle 6 at a small flow rate, the shut-off valve 114 is closed and the switching valve 115 is opened, so as to supply purified water at a small flow rate from the DIW supply source 117 through the line 116 into the line 84. However, when the shut-off valve 114 is closed, the flow rate of purified water supplied into the front surface liquid supply nozzle 5 is greatly increased. Accordingly, along with the closing operation of the shut-off valve 114, the flow rate switching valve 110 is operated to decrease the flow rate of purified water supplied into the front surface liquid supply nozzle 5.

In addition to this liquid supply mechanism 85', the line 84b is connected to a drying gas supply line 119 through a switching valve 118 downstream from the switching valve 115. When the switching valve 118 is opened, a drying gas, such as N₂ gas, is supplied from the drying gas line 119 through the line 84b into the nozzle hole 6a, so that the drying gas is spouted from the liquid delivery port 24a onto the center of the back surface of the wafer W.

Figure 9:
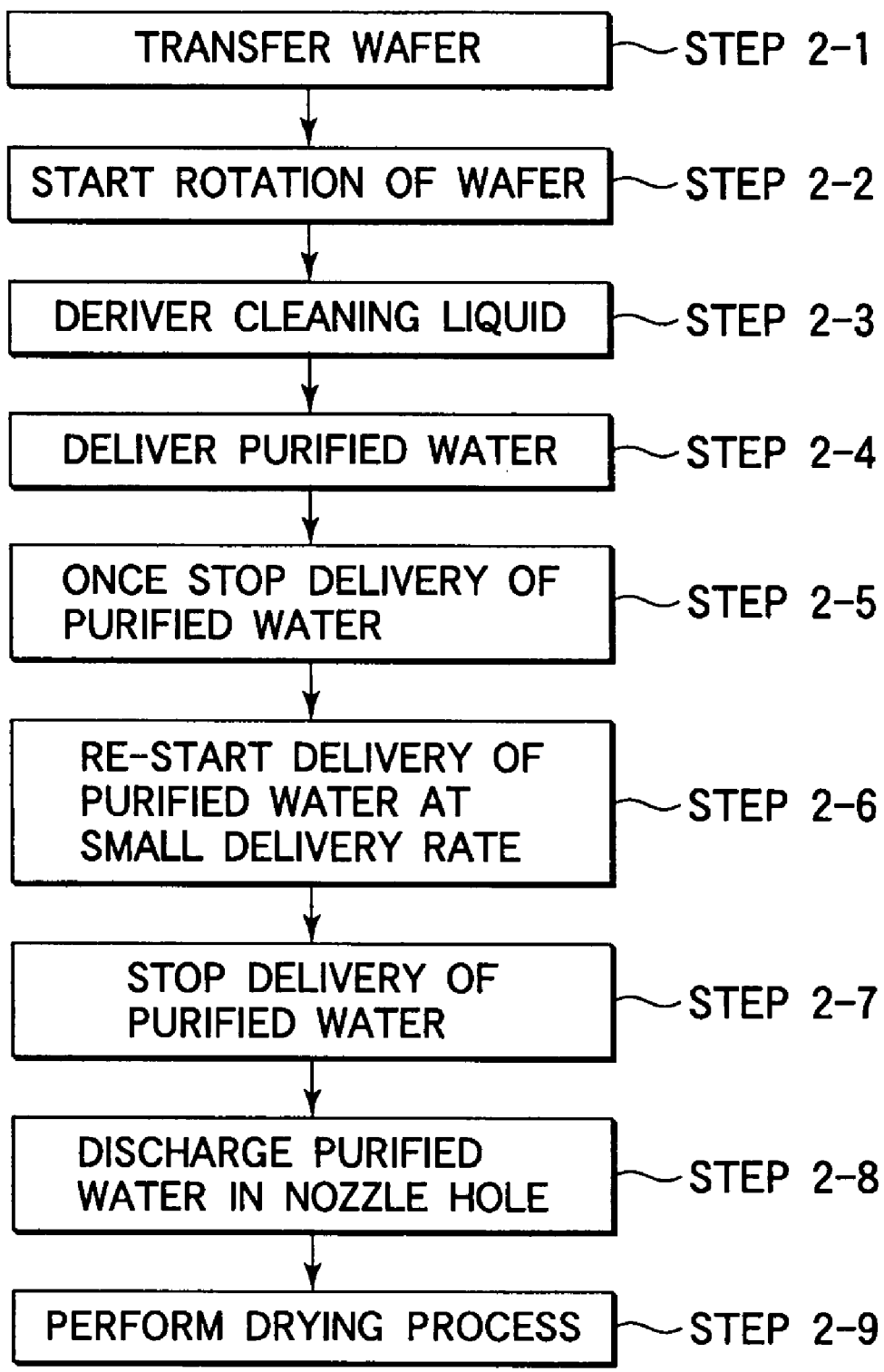
FIG. 9 is a flow chart showing the operational flow of a cleaning method according to a second embodiment, which is one of the preferable embodiments of the present invention.

Next, an explanation will be given of a second embodiment, which is one of the preferable embodiments, performed by use of the arrangement shown in FIG. 8, with reference to the flow chart shown in FIG. 9 and the schematic views shown in FIGS. 10A to 10I. The second embodiment is preferably applied to a case where the back surface of a wafer W is hydrophobic.

In the second embodiment, the same operations as those of STEP 1-1 to STEP 1-5 of the first embodiment are performed from a step of transferring a wafer to a step of once stopping delivery of purified water (STEP 2-1 to STEP 2-5 and FIGS. 10A to 10E).

Then, as in STEP 1-6 of the first embodiment, delivery of the rinsing liquid or purified water is re-started (STEP 2-6 and FIG. 10F). However, at this time, the delivery rate of purified water is set to be lower than that of the first delivery thereof (STEP 2-4). This is so, because, if the delivery rate is too high, a liquid film is hardly formed on the liquid delivery plate 24. Specifically, the delivery rate of purified water is preferably set to be 0.1 to 0.3 L/min. At this time, the rotation speed of the wafer W is preferably set to be 100 to 300 rpm. Where purified water is supplied at a small delivery rate, it is supplied from the DIW supply source 117 for a small flow rate through the line 116.

Then, the delivery of purified water is stopped (STEP 2-7 and FIG. 10G). This is so, because liquid is left on the peripheral portion of the liquid delivery plate 24 and makes drying insufficient, if purified water inside the nozzle hole 6a is discharged immediately from a state where purified water is being delivered. Where delivery of purified water is stopped before it is discharged, water columns formed between the liquid delivery plate 24 and wafer back surface become thin, so that liquid is prevented from being left on the peripheral portion of the liquid delivery plate 24. At this time, the rotation speed of the wafer W is preferably set to be 100 to 300 rpm.

Thereafter, the valve 95 is opened to discharge purified water in the nozzle hole 6a by the liquid's own weight or suction of an aspirator or the like (STEP 2-8 and FIG. 10H). This step is performed to remove the liquid from the upper surface of the rotary plate 11 as far as possible, and to prevent the liquid from being mixed with another liquid in the nozzle hole 6a, as in STEP 1-7 of the first embodiment.

After the rinsing step is finished by discharging purified water, a throwing off and drying operation is performed on the wafer W while supply of the rinsing liquid or purified water is stopped (STEP 2-9 and FIG. 10I). At this time, the rotation speed of the wafer W is preferable set to be 1,000 to 2,000 rpm.

Figure 11:
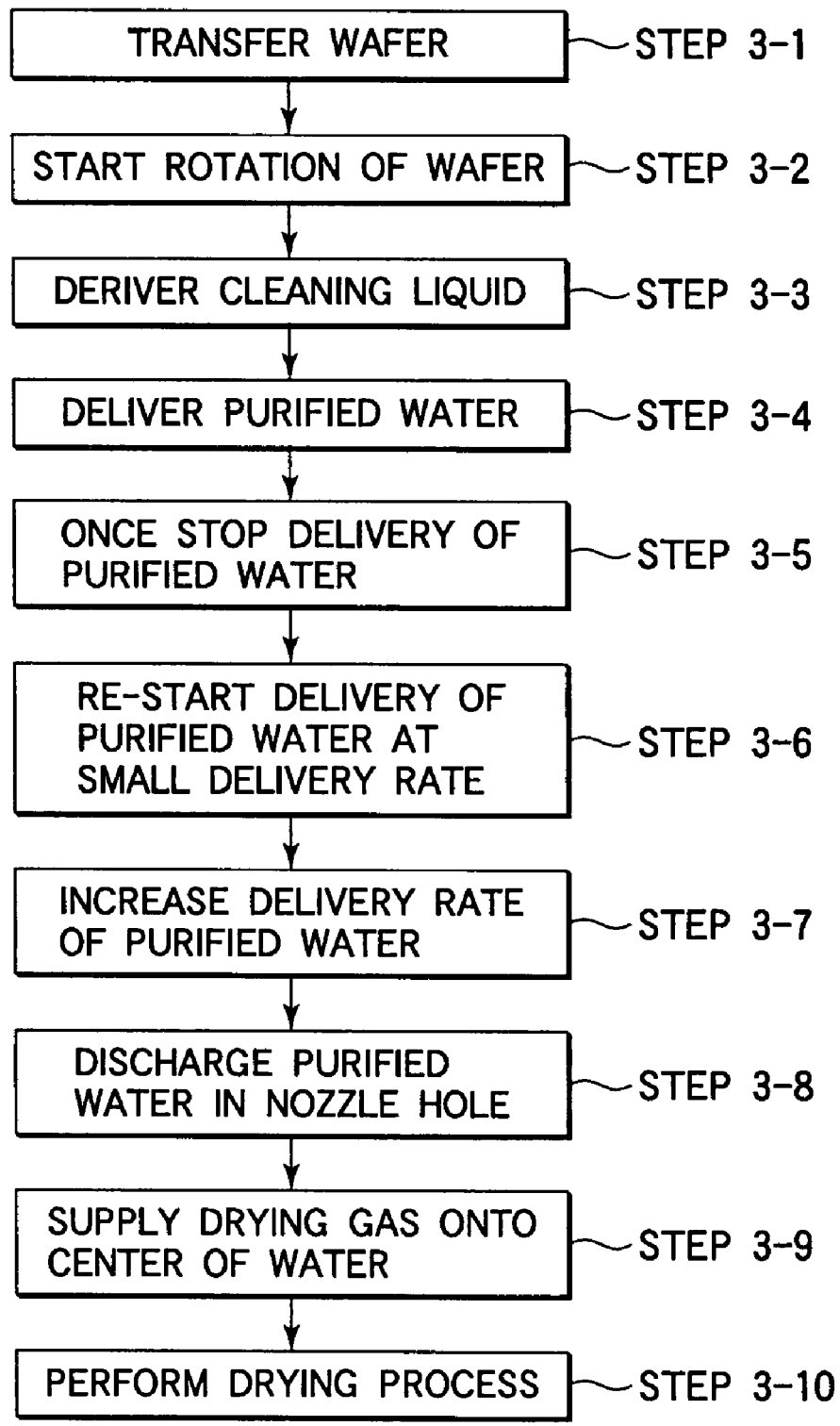
FIG. 11 is a flow chart showing the operational flow of a cleaning method according to a third embodiment, which is one of the preferable embodiments of the present invention.

Next, an explanation will be given of a third embodiment with reference to the flow chart shown in FIG. 11 and the schematic views shown in FIGS. 12A to 12J. The third embodiment is preferably applied to a case where the back surface of a wafer W is hydrophilic.

In the third embodiment, the same operations as those of STEP 2-1 to STEP 2-6 of the second embodiment are performed from a step of transferring a wafer to a step of re-starting delivery of purified water (STEP 3-1 to STEP 3-6 and FIGS. 12A to 12F).

Then, the delivery rate of purified water is increased (STEP 3-7 and FIG. 12G). This is so, because purified water delivered from the nozzle hole 6a is attracted by the wafer back surface and is inhibited from being spread on the liquid delivery plate 24, where the wafer back surface is hydrophilic. By increasing the delivery rate of purified water, purified water can be easily spread all over the liquid delivery plate 24. At this time, the delivery rate of purified water is preferably set to be 0.5 to 1.5 L/min. Further, at this time, the rotation speed of the wafer W is preferably set to be 100 to 300 rpm.

Thereafter, the valve 95 is opened to discharge purified water in the nozzle hole 6a by the liquid's own weight or suction of an aspirator or the like (STEP 3-8 and FIG. 12H). This step is performed to remove the liquid from the upper surface of the rotary plate 11 as far as possible, and to prevent the liquid from being mixed with another liquid in the nozzle hole 6a, as in STEP 1-7 of the first embodiment ⊘STEP 1-7.

Thereafter, a drying gas, such as N₂ gas, is supplied from the drying gas supply line 119 through the line 84b into the nozzle hole 6a, and is spouted from the liquid delivery port 24a onto the center of the wafer back surface (STEP 3-9 and FIG. 12I). Since the center of the wafer back surface does not receive centrifugal force, atmosphere replacement thereon is inefficient and drying tends to be insufficient at the center of the wafer back surface where the wafer back surface is hydrophilic. In light of this problem, a drying gas is spouted onto the center of the wafer back surface to facilitate drying. At this time, the flow rate of the drying gas is preferably set to be 1 to 50 NL/min.

Then, N₂ gas is stopped, and a throwing off and drying operation is performed on the wafer W (STEP 3-10 and FIG. 12J). At this time, the rotation speed of the wafer W is preferably set to be 1,000 to 2,000 rpm.

Figure 13:
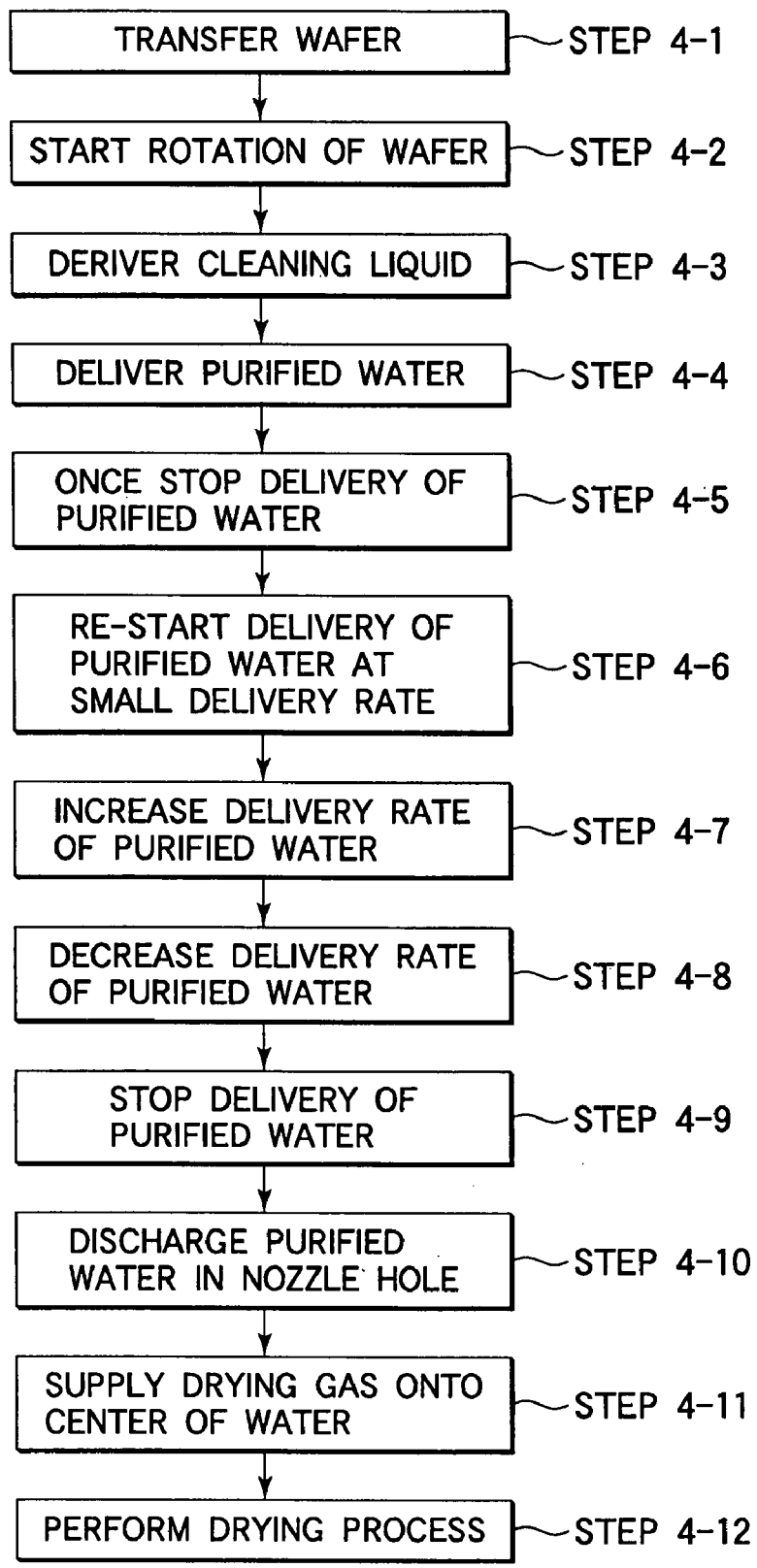
FIG. 13 is a flow chart showing the operational flow of a cleaning method according to a fourth embodiment, which is one of the preferable embodiments of the present invention.

Next, an explanation will be given of a fourth embodiment with reference to the flow chart shown in FIG. 13 and the schematic views shown in FIGS. 14A to 14L. The second embodiment and third embodiment described above are preferable, when it is clear as to whether the back surface of a wafer W is hydrophobic or hydrophilic. However, in practice, it may be unclear as to whether the back surface of a wafer W is hydrophobic or hydrophilic. Accordingly, the fourth embodiment is conceived to provide a method for performing a good process without reference to a wafer W being hydrophobic or hydrophilic.

In the fourth embodiment, the same operations as those of STEP 3-1 to STEP 3-6 of the third embodiment are performed from a step of transferring a wafer to a step of re-starting delivery of purified water (STEP 4-1 to STEP 4-6 and FIGS. 14A to 14F). Then, in light of a case where the back surface of the wafer W is hydrophilic, the delivery rate of purified water is increased (STEP 4-7 and FIG. 14G), as in STEP 3-7 of the third embodiment.

However, where the back surface of the wafer is hydrophobic, liquid is left on the peripheral portion of the liquid delivery plate 24 and makes drying insufficient, if the liquid inside the nozzle hole 6a is discharged immediately from a state where the delivery rate of purified water is increased. Accordingly, the delivery rate of purified water is decreased (STEP 4-8 and FIG. 14H). At this time, the delivery rate of purified water is preferable set to be 0.1 to 0.3 L/min. Further, at this time, the wafer rotation speed is preferable set to be 100 to 300 rpm.

After the delivery rate of purified water is thus decreased, delivery of purified water is stopped (STEP 4-9 and FIG. 14I), as in STEP 2-7 of the second embodiment. This is performed in light of a case where the back surface of the wafer is hydrophobic, because the following problem is caused, if the delivery rate of purified water is merely decreased. Specifically, when purified water in the nozzle hole 6a is discharged thereafter, liquid is left on the peripheral portion of the liquid delivery plate 24 and makes drying insufficient. Accordingly, delivery of purified water is stopped before it is discharged, so that liquid is prevented from being left on the peripheral portion of the liquid delivery plate 24, as in STEP 2-7 of the second embodiment. At this time, the rotation speed of the wafer W is preferably set to be 100 to 300 rpm.

Thereafter, the valve 95 is opened to discharge purified water in the nozzle hole 6a by the liquid's own weight or suction of an aspirator or the like (STEP 4-10 and FIG. 14J). This step is performed to remove the liquid from the upper surface of the rotary plate 11 as far as possible, and to prevent the liquid from being mixed with another liquid in the nozzle hole 6a, as in STEP 1-7 of the first embodiment.

Thereafter, in light of a case where the back surface of the wafer is hydrophilic, a drying gas, such as $N_2$ gas, is spouted from the nozzle hole 6a onto the center of the wafer back surface (STEP 4-11 and FIG. 14K). This is performed as in STEP 3-9 of the third embodiment, because the center of the wafer back surface tends to suffer insufficient drying where the wafer back surface is hydrophilic. Accordingly, a drying gas is spouted onto the center of the wafer back surface to facilitate drying. At this time, the flow rate of the drying gas is preferably set to be 1 to 50 NL/min.

Then, $N_2$ gas is stopped, and a throwing off and drying operation is performed on the wafer W (STEP 4-12 and FIG. 14L). At this time, the rotation speed of the wafer W is preferably set to be 1,000 to 2,000 rpm.

In the first to fourth embodiments, the liquid delivery plate 24 is subjected to cleaning by use of a rinsing liquid or purified water. Where the liquid delivery plate 24 should be more sufficiently subjected to cleaning by use of a cleaning liquid, the following cleaning method according to a fifth embodiment may be used.

Figure 15:
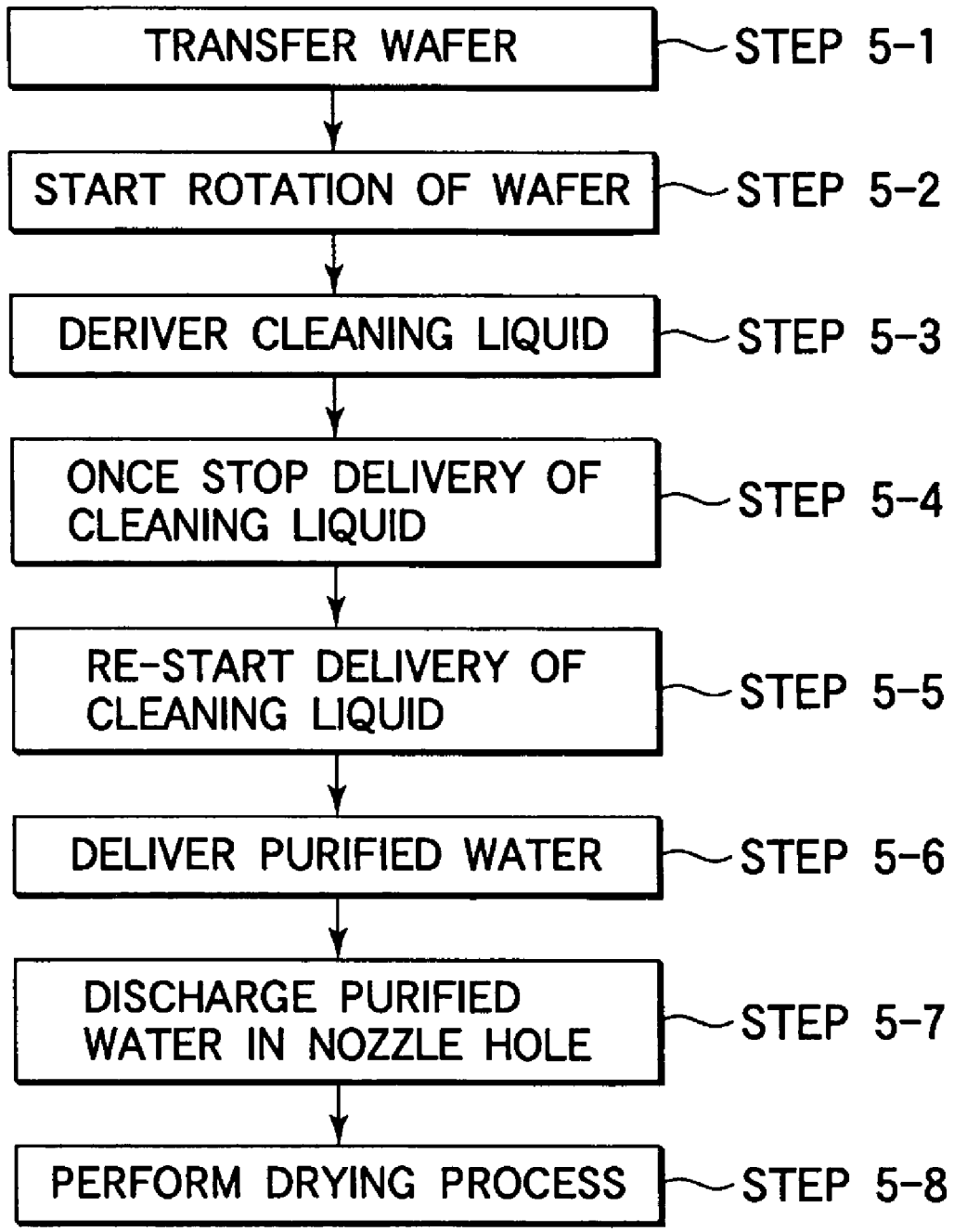
FIG. 15 is a flow chart showing the operational flow of a cleaning method according to a fifth embodiment of the present invention.

FIG. 15 is a flow chart showing the operational flow of a cleaning method according to a fifth embodiment of the present invention. FIGS. 16A to 16H are schematic views for explaining the operation thereof. In this embodiment, the arrangement shown in FIG. 3 is used as a liquid supply mechanism.

At first, in STEP 5-1 to 5-3 of FIG. 15 shown in FIGS. 16A to 16C, the same operations as those of STEP 1-1 to 1-3 of the first embodiment shown in FIGS. 7A to 7C are performed. In the state of STEP 5-3 shown in FIG. 16C, a liquid film of the cleaning liquid is formed on the back surface of a wafer W. However, at the beginning, the back surface liquid supply nozzle 6 is not filled with liquid, so no liquid film is formed on the liquid delivery plate 24 when the cleaning liquid starts being delivered. Accordingly, delivery of the cleaning liquid is once stopped, so that the back surface liquid supply nozzle 6 is filled with the cleaning liquid (STEP 5-4 and FIG. 16D).

In this state, delivery of the cleaning liquid is re-started, whereby a liquid film is formed on the upper surface of the liquid delivery plate 24. Consequently, the back surface of the wafer W and the upper surface of the liquid delivery plate 24 are subjected to cleaning (STEP 5-5 and FIG. 16E).

After the cleaning using the cleaning liquid is finished, the process liquid is switched in a continuous operation from the cleaning liquid to purified water used as a rinsing liquid to perform a rinsing process (STEP 5-6 and FIG. 16F). At this time, the rinsing liquid or purified water is delivered from the back surface liquid supply nozzle 6, so that a liquid film of purified water is formed on the back surface of the wafer W. Further, at this time, a liquid film of purified water is also formed on the upper surface of the liquid delivery plate 24, so that the liquid delivery plate 24 is subjected to a rinsing process.

After the rinsing process is finished, the valve 95 is opened to discharge purified water in the nozzle hole 6a by the liquid's own weight or suction of an aspirator or the like (STEP 5-7 and FIG. 16G). This step is performed in the same manner as in STEP 1-7 of the first embodiment shown in FIG. 7G.

Also in this embodiment, where at least the upper surface of the liquid delivery plate 24 is made of a hydrophobic material, no water droplets are left thereon when the rinsing process shown in FIG. 16G is finished, because purified water on the upper surface of the liquid delivery plate 24 has been thrown off along with purified water on the wafer W. Consequently, the wafer W is prevented from being contaminated with remaining water droplets deposited thereon.

After the rinsing step, as shown in FIG. 16H, a throwing off and drying operation is performed on the wafer W while supply of the rinsing liquid or purified water is stopped (STEP 5-8). This step is performed in the same manner as in STEP 1-8 shown in FIG. 7H.

As described above, when a cleaning process using a cleaning liquid and a rinsing process using purified water are performed on the back surface of the wafer W, a cleaning process and a rinsing process are also performed on the front surface of the wafer W while a cleaning liquid and a rinsing liquid or purified water are respectively supplied from the front surface liquid supply nozzle 5.

As described above, delivery of a cleaning liquid or a rinsing liquid or purified water is once stopped and then re-started, whereby a liquid film of the process liquid is formed on the upper surface of the liquid delivery plate 24 so that the surface is subjected to cleaning. Accordingly, a wafer W is effective prevented from being contaminated when a wafer W comes into contact with the liquid delivery plate 24.

In the cleaning apparatus 100 having the structure described above, the cup surrounding a wafer W is the rotary cup 4 that is rotated along with the wafer W. Accordingly, during a cleaning method performed in this apparatus, a centrifugal force acts on the process liquid, when a process liquid is thrown off from the wafer W and hits against the rotary cup 4. In this case, the process liquid is inhibited from being scattered (turned into mist), unlike a case where a stationary cup is used for the same purpose. Then, the process liquid is guided downward by the rotary cup 4, and is discharged through the gap 33 into the main cup portion 56a of the drain cup 51. Further, since the rotary plate 11 has holes for inserting the holding portions 14a at positions where the holding accessories 14 are attached, the process liquid drops through the holes into the auxiliary cup portion 56b of the drain cup 51. The process liquid thus received by the drain cup 51 is discharged from the drain port 60 through the drain tube 61, while it is circulated in the drain cup 51. Further, gas components are collected from inside and around the rotary cup 4 into the exhaust cup 52 through the annular inlet port 68 formed between the upper wall 67 and the eaves portion 31 of the rotary cup 4, and are discharged from the exhaust ports 70 through the exhaust tube 71.

Due to the presence of the rotary cup 4, the drain cup 51 can be smaller as long as it is usable for draining. Further, the drain cup 51 and exhaust cup 52 are independent of each other such that exhaust gas and drainage are separately collected and separately discharged through the drain port 60 and exhaust ports 70. Accordingly, there is no need to dispose a special mechanism for separating drainage and exhaust gas. Further, since the drain cup 51 is accommodated within the exhaust cup 52, the structure for collecting exhaust gas and drainage can be arranged to have a smaller occupation space, so the apparatus can be compact with a small foot print. Furthermore, since the drain cup 51 is accommodated within the exhaust cup 52, it is possible to trap mist of a process liquid leaked out of the drain cup 51, thereby preventing the mist from exerting a bad influence while being scattered out of the apparatus.

According to the embodiments described above, a cleaning liquid or rinsing liquid is delivered from the back surface liquid supply nozzle, so that a liquid film of the cleaning liquid or rinsing liquid is formed on the substrate back surface. Then, the delivery of the cleaning liquid or rinsing liquid is stopped and then re-started, whereby a liquid film of the cleaning liquid or rinsing liquid is also formed on a portion around the liquid delivery port. Consequently, when cleaning is performed on the substrate back surface, cleaning is also performed on the portion around the liquid delivery port, so the substrate supported thereon is prevented from being contaminated.

The present invention is not limited to the embodiments described above, and it may be modified in various manners. For example, the embodiments described above are exemplified by a cleaning apparatus for cleaning the front and back surfaces of a wafer. However, the present invention may be applied to a cleaning apparatus for cleaning only the back surface of a wafer. In the embodiments described above, the target substrate is exemplified by a semiconductor wafer, but the present invention may be applied to another substrate, such as a substrate for flat panel display devices (FPD), a representative of which is a glass substrate for liquid crystal display devices (LCD).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cleaning method performed in a cleaning apparatus comprising a substrate holding member including a rotary plate configured to rotate in a horizontal state and a holding accessory attached to the rotary plate and configured to hold a substrate above the rotary plate in a horizontal state with a gap therebetween, a rotation mechanism configured to rotate the rotary plate along with the substrate, a non-rotatable liquid delivery plate disposed in an opening formed at a center of the rotary plate and including a liquid delivery port located near a rotational center of the rotary plate and configured to deliver a liquid onto a center of a back surface of the substrate held on the holding member, a back surface liquid supply nozzle connected to the liquid delivery port and configured to supply a cleaning liquid and a rinsing liquid to deliver the cleaning liquid and the rinsing liquid through the liquid delivery port onto the back surface of the substrate, a cup configured to surround the substrate held on the substrate holding member, support pins extending upward on the liquid delivery plate around the liquid delivery port, and an elevating mechanism configured to move the liquid delivery plate integrally with the support pins along the opening of the rotary plate so that the support pins move up and down to assist transfer of the substrate to and from the substrate holding member, the method comprising:
receiving the substrate by the support pins set at an upper position integrally with the liquid delivery plate by the elevating mechanism;
then moving down the support pins integrally with the liquid delivery plate by the elevating mechanism and holding the substrate on the substrate holding member;
then setting the support pins at a lower position integrally with the liquid delivery plate by the elevating mechanism and rotating the rotary plate along with the substrate held thereon;
performing a cleaning process that comprises rotating the substrate, while delivering the cleaning liquid from the back surface liquid supply nozzle through the delivery port, thereby forming a liquid film of the cleaning liquid on the back surface of the substrate;
then sequentially performing a rinsing process that comprises rotating the substrate, while delivering the rinsing liquid from the back surface liquid supply nozzle through the liquid delivery port, thereby forming a liquid film of the rinsing liquid on the back surface of the substrate; and
then performing a throwing off and drying process that comprises rotating the substrate at a predetermined rotation speed,
wherein the rinsing process comprises:
a first sub-step of delivering the rinsing liquid at a first delivery rate from the back surface liquid supply nozzle through the liquid delivery port while rotating the substrate at a first rotation speed to form a first liquid film on the back surface of the substrate,
a second sub-step of then stopping delivery of the rinsing liquid from the back surface liquid supply nozzle to fill the back surface liquid supply nozzle with the rinsing liquid, while continuing substrate rotation from the first sub-step, and
a third sub-step of re-starting delivery of the rinsing liquid from the back surface liquid supply nozzle while continuing substrate rotation from the second sub-step to form a second liquid film on the liquid delivery plate and the support pins so as to clean the liquid delivery plate and the support pins while rinsing the substrate, wherein the third sub-step includes a first operation of delivering the rinsing liquid at a second delivery rate smaller than the first delivery rate while rotating the substrate at a second rotation speed, and a second operation of delivering the rinsing liquid at a third delivery rate larger than the second delivery rate while rotating the substrate at a third rotation speed, such that the first and second operations are continuously performed in this order directly following the second sub-step.

2. The cleaning method according to claim 1, wherein the method comprises discharging the rinsing liquid left inside the back surface liquid supply nozzle after the rinsing process.

3. The cleaning method according to claim 1, wherein the method comprises supplying a drying gas onto the center of the back surface of the substrate by a drying gas supply mechanism after the rinsing process and before the throwing off and drying process.

4. The cleaning method according to claim 1, wherein the liquid delivery plate has an upper surface made of a hydrophobic material.

5. The cleaning method according to claim 1, wherein the substrate is rotated at a rotation speed of 200 to 700 rpm in the cleaning process and the substrate is rotated at a rotation speed of 1,000 to 2,000 rpm in the throwing off and drying process.

6. The cleaning method according to claim 1, wherein the first liquid film is formed such that it is not present on the support pins.

7. The cleaning method according to claim 1, wherein the first sub-step sets the first rotation speed to be 200 to 1,000 rpm and the first delivery rate to be 1.0 to 2.0 L/min, and the third sub-step sets the second and third rotation speeds to be 100 to 300 rpm, the second delivery rate to be 0.1 to 0.3 L/min, and the third delivery rate to be 0.5 to 1.5 L/min.

8. The cleaning method according to claim 1, wherein the third sub-step further includes a third operation of delivering the rinsing liquid at a fourth delivery rate smaller than the third delivery rate while rotating the substrate at a fourth rotation speed continuously, and a fourth operation of stopping delivery of the rinsing liquid, such that the third and fourth operations are continuously performed in this order directly following the second operation.

9. The cleaning method according to claim 8, wherein the third sub-step sets the fourth rotation speed to be 100 to 300 rpm and the fourth delivery rate to be 0.1 to 0.3 L/min.

10. A non-transitory computer readable storage medium that stores a computer program for execution on a processor used for a cleaning apparatus comprising a substrate holding member including a rotary plate configured to rotate in a horizontal state and a holding accessory attached to the rotary plate and configured to hold a substrate above the rotary plate in a horizontal state with a gap therebetween, a rotation mechanism configured to rotate the rotary plate along with the substrate, a non-rotatable liquid delivery plate disposed in an opening formed at a center of the rotary plate and including a liquid delivery port located near a rotational center of the rotary plate and configured to deliver a liquid onto a center of a back surface of the substrate held on the holding member, a back surface liquid supply nozzle connected to the liquid delivery port and configured to supply a cleaning liquid and a rinsing liquid to deliver the cleaning liquid and the rinsing liquid through the liquid delivery port onto the back surface of the substrate, a cup configured to surround the substrate held on the substrate holding member, support pins extending upward on the liquid delivery plate around the liquid delivery port, and an elevating mechanism configured to move the liquid delivery plate integrally with the support pins along the opening of the rotary plate so that the support pins move up and down to assist transfer of the substrate to and from the substrate holding member, the computer program, when executed by the processor, controlling the cleaning apparatus to perform a cleaning method comprising:

receiving the substrate by the support pins set at an upper position integrally with the liquid delivery plate by the elevating mechanism;

then moving down the support pins integrally with the liquid delivery plate by the elevating mechanism and holding the substrate on the substrate holding member;

then setting the support pins at a lower position integrally with the liquid delivery plate by the elevating mechanism and rotating the rotary plate along with the substrate held thereon;

performing a cleaning process that comprises rotating the substrate, while delivering the cleaning liquid from the back surface liquid supply nozzle through the delivery port, thereby forming a liquid film of the cleaning liquid on the back surface of the substrate;

then sequentially performing a rinsing process that comprises rotating the substrate, while delivering the rinsing liquid from the back surface liquid supply nozzle through the liquid delivery port, thereby forming a liquid film of the rinsing liquid on the back surface of the substrate; and then performing a throwing off and drying process that comprises rotating the substrate at a predetermined rotation speed, wherein the rinsing process comprises:

a first sub-step of delivering the rinsing liquid at a first delivery rate from the back surface liquid supply nozzle through the liquid delivery port while rotating the substrate at a first rotation speed to form a first liquid film on the back surface of the substrate, a second sub-step of then stopping delivery of the rinsing liquid from the back surface liquid supply nozzle to fill the back surface liquid supply nozzle with the rinsing liquid, while continuing substrate rotation from the first sub-step, and a third sub-step of then re-starting delivery of the rinsing liquid from the back surface liquid supply nozzle while continuing substrate rotation from the second sub-step to form a second liquid film on the liquid delivery plate and the support pins so as to clean the liquid delivery plate and the support pins while rinsing the substrate, wherein the third sub-step includes a first operation of delivering the rinsing liquid at a second delivery rate smaller than the first delivery rate while rotating the substrate at a second rotation speed, and a second operation of delivering the rinsing liquid at a third delivery rate larger than the second delivery rate while rotating the substrate at a third rotation speed, such that the first and second operations are continuously performed in this order directly following the second sub-step.

* * * * *